(12) United States Patent
Kajiyama

(10) Patent No.: US 8,009,464 B2
(45) Date of Patent: Aug. 30, 2011

(54) MAGNETIC RANDOM ACCESS MEMORY AND MANUFACTURING METHOD THEREOF

(75) Inventor: Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 832 days.

(21) Appl. No.: 12/038,015

(22) Filed: Feb. 27, 2008

(65) Prior Publication Data

US 2008/0209118 A1    Aug. 28, 2008

(30) Foreign Application Priority Data

Feb. 28, 2007    (JP) ................. 2007-050416

(51) Int. Cl.
*G11C 11/00* (2006.01)
(52) U.S. Cl. .......... 365/158; 365/171; 365/173
(58) Field of Classification Search .......... 365/158, 365/171, 173
See application file for complete search history.

(56) References Cited

U.S. PATENT DOCUMENTS

| 6,855,564 | B2  | 2/2005 | Cha |
| 7,095,069 | B2  | 8/2006 | Cha |
| 7,205,598 | B2  | 4/2007 | Voshell et al. |
| 7,919,826 | B2* | 4/2011 | Iwayama et al. ............. 257/421 |
| 2004/0100818 | A1* | 5/2004 | Yoda et al. ..................... 365/173 |
| 2005/0007819 | A1* | 1/2005 | Fukuzumi ...................... 365/171 |
| 2005/0259464 | A1* | 11/2005 | Kajiyama et al. ............. 365/171 |

FOREIGN PATENT DOCUMENTS

| JP | 2002-208682 | 7/2002 |
| JP | 2004-179489 | 6/2004 |

* cited by examiner

*Primary Examiner* — Anh Phung
*Assistant Examiner* — Toan Le
(74) *Attorney, Agent, or Firm* — Oblon, Spivak, McClelland, Maier & Neustadt, L.L.P.

(57) ABSTRACT

A magnetic random access memory includes a semiconductor substrate in which a step portion having a side surface and a top face is formed, a gate electrode formed on the side surface of the step portion through a gate insulating film, a drain diffusion layer formed in the top face of the step portion, a source diffusion layer formed in the semiconductor substrate below the drain diffusion layer to be separated from the drain diffusion layer, a magnetoresistive effect element which is connected with the drain diffusion layer, and has a fixed layer, a recording layer and a non-magnetic layer, the magnetization directions of the fixed layer and the recording layer entering a parallel state or an antiparallel state in accordance with a direction of a current flowing through a space between the fixed layer and the recording layer, and a bit line connected with the magnetoresistive effect element.

13 Claims, 40 Drawing Sheets

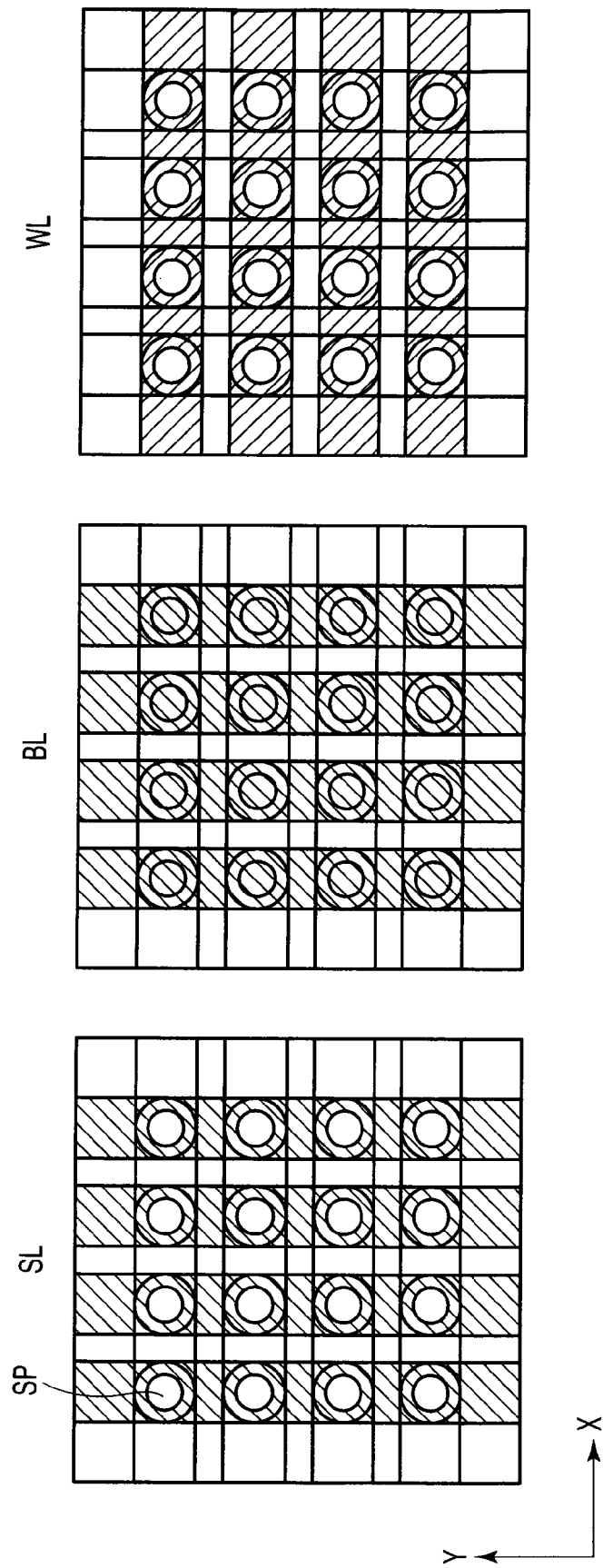

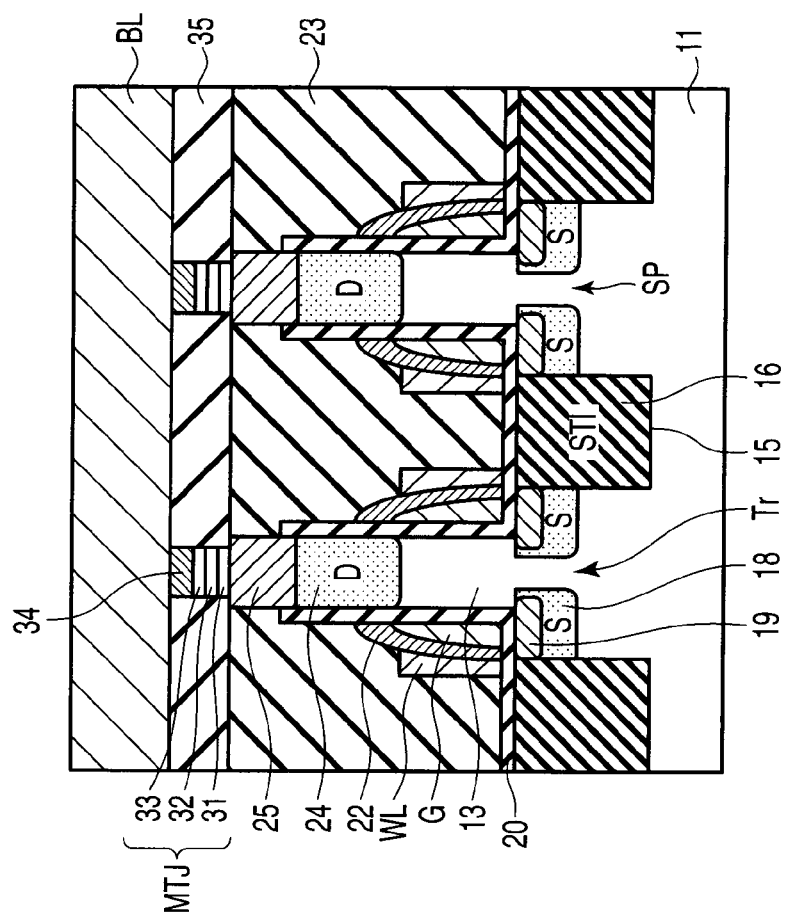
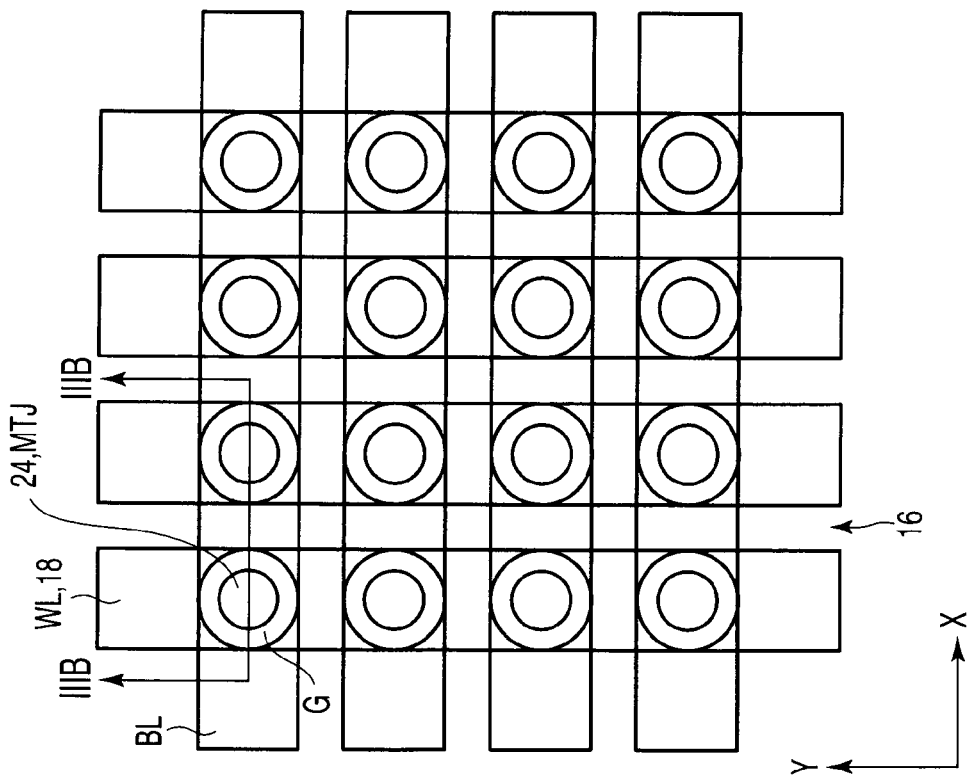
FIG. 3B
FIG. 3A

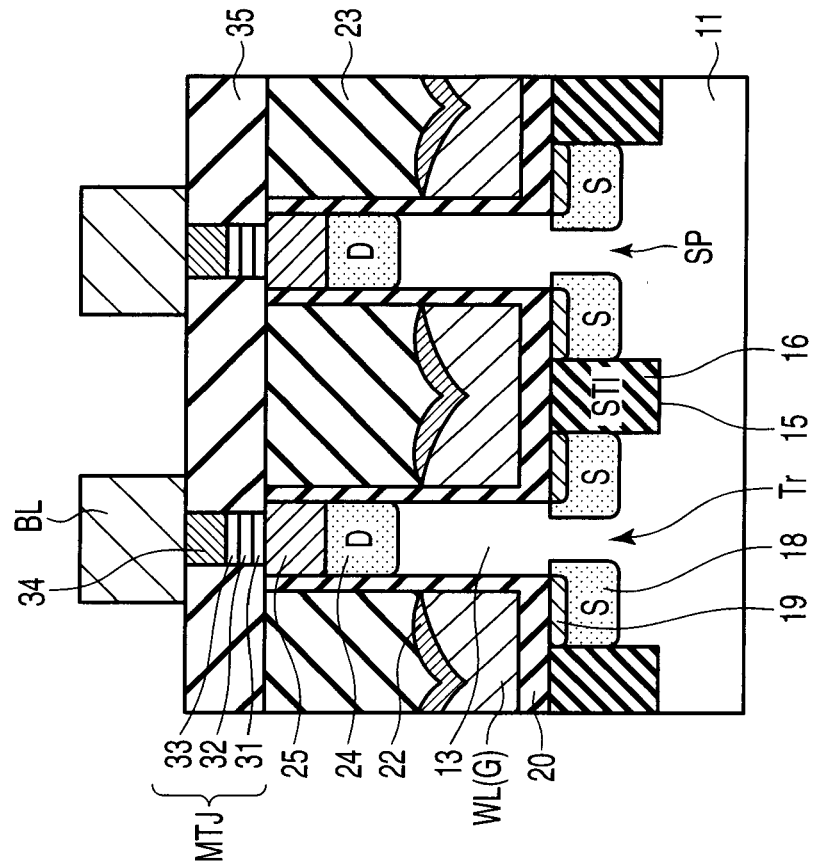
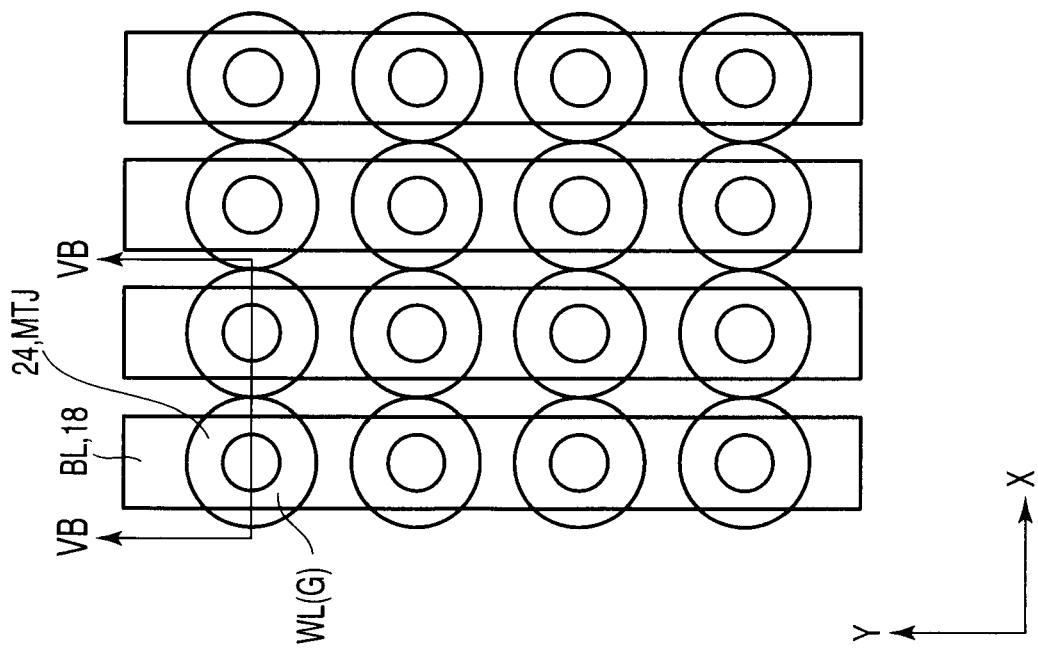
FIG. 5B
FIG. 5A

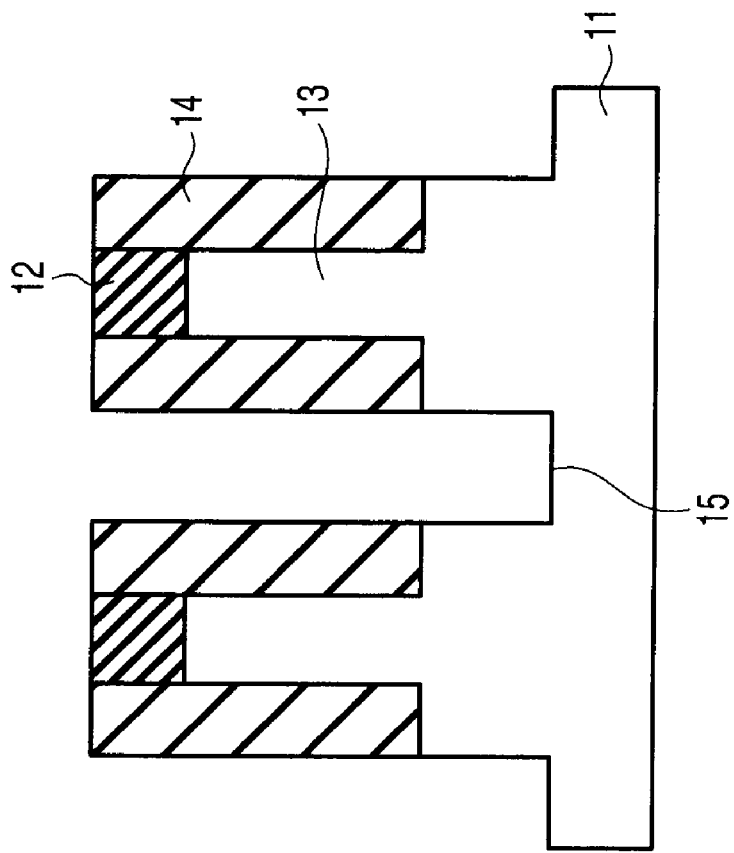
F I G. 9 B
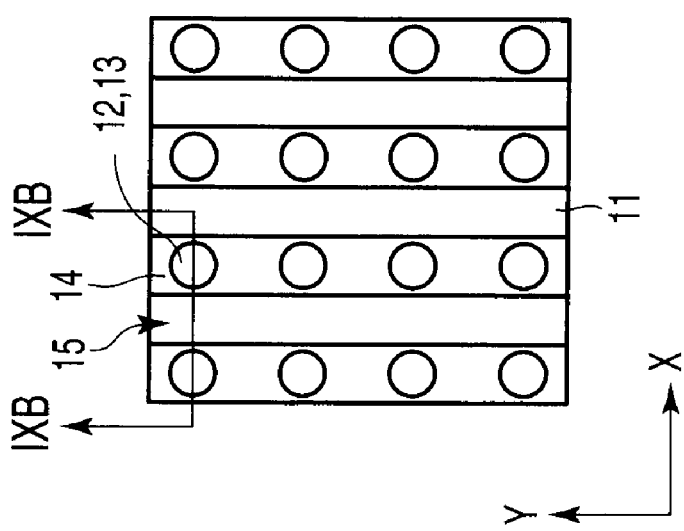
F I G. 9 A

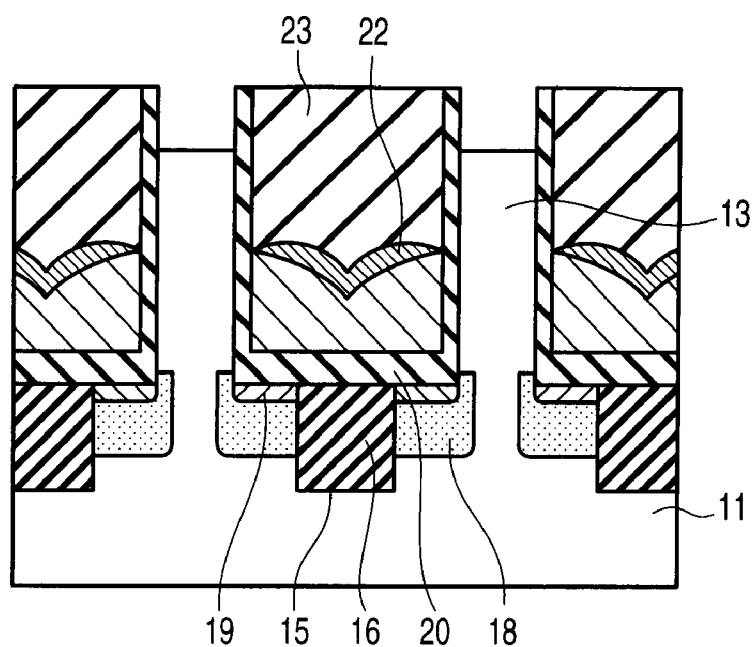
F I G. 2 1
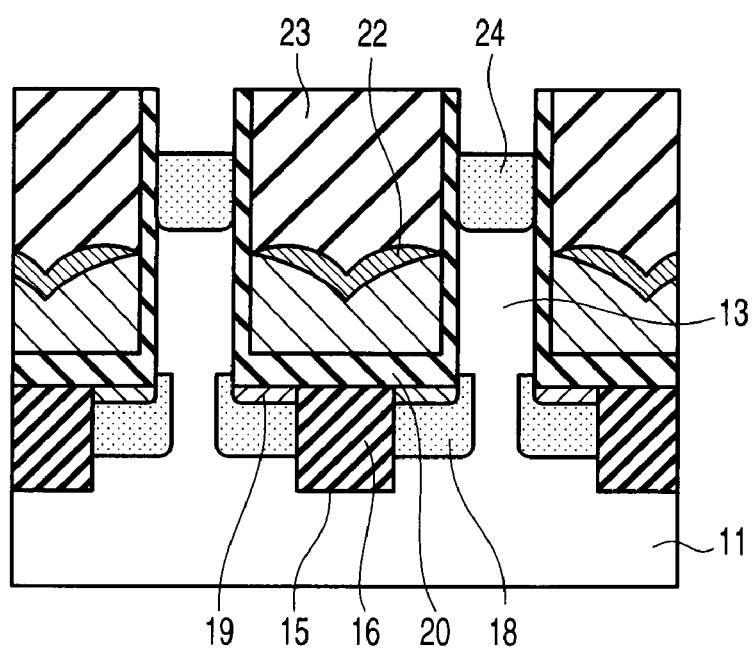
F I G. 2 2

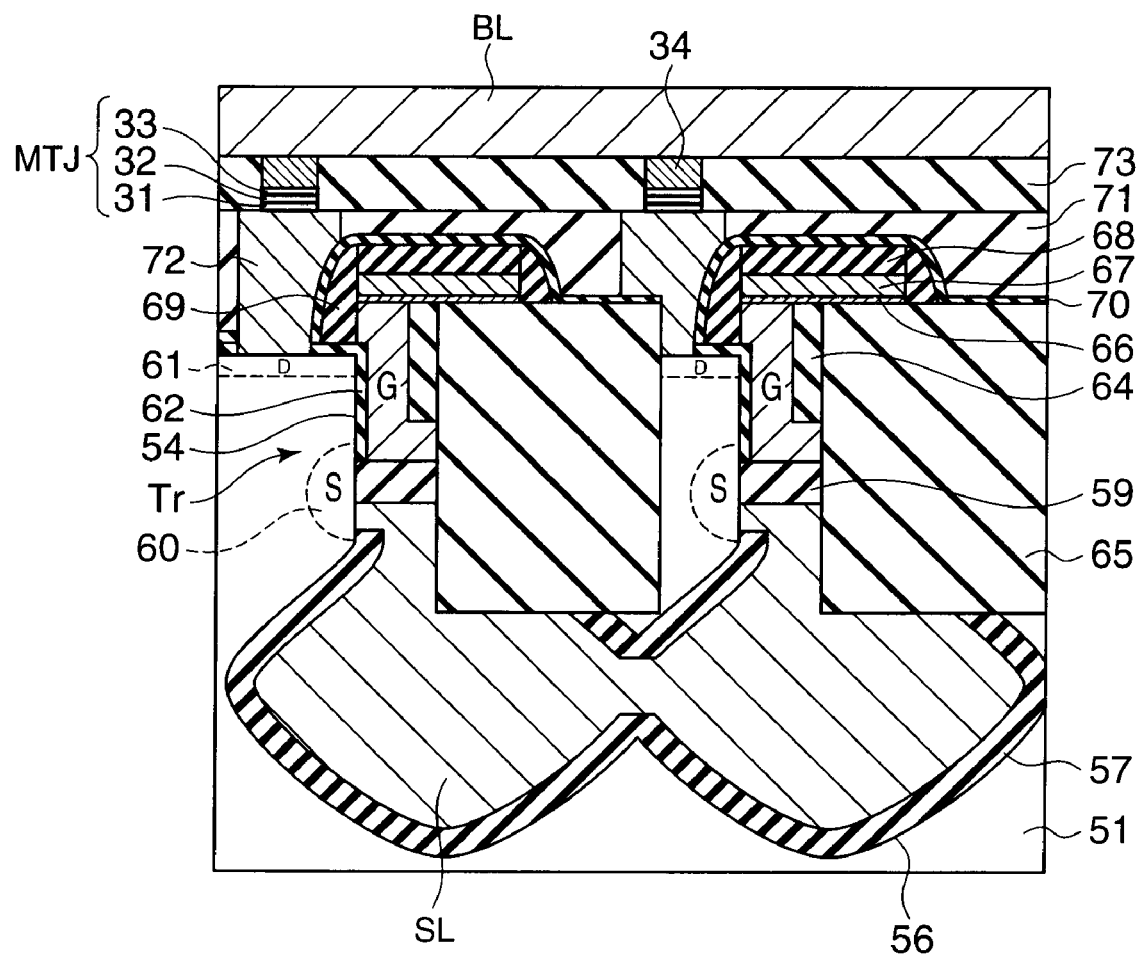
F I G. 27

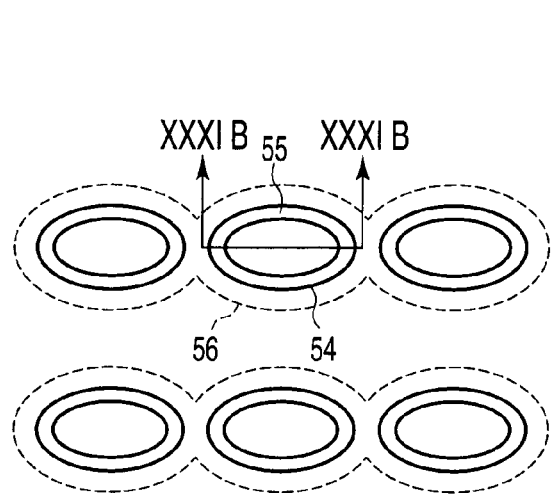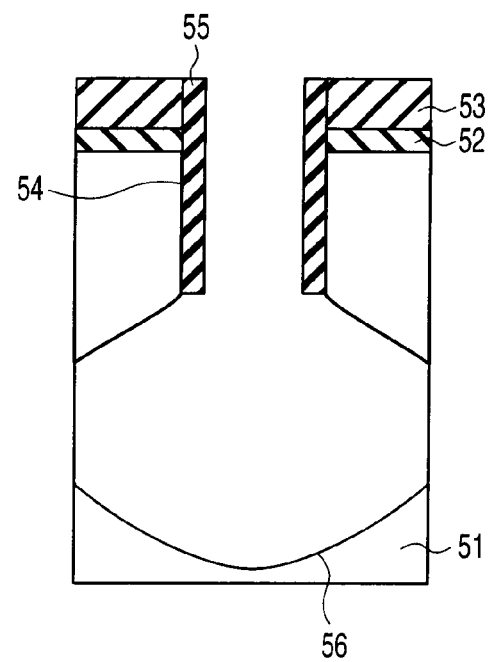
FIG. 31A　　　FIG. 31B
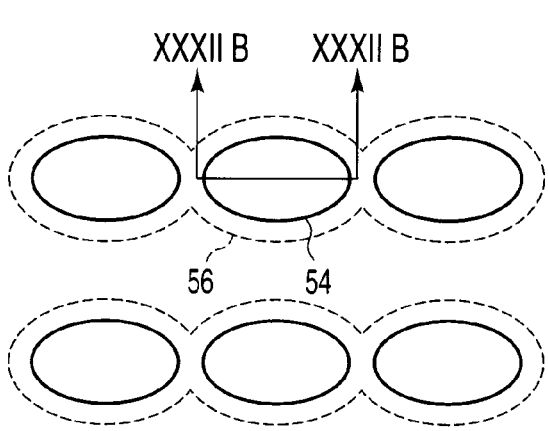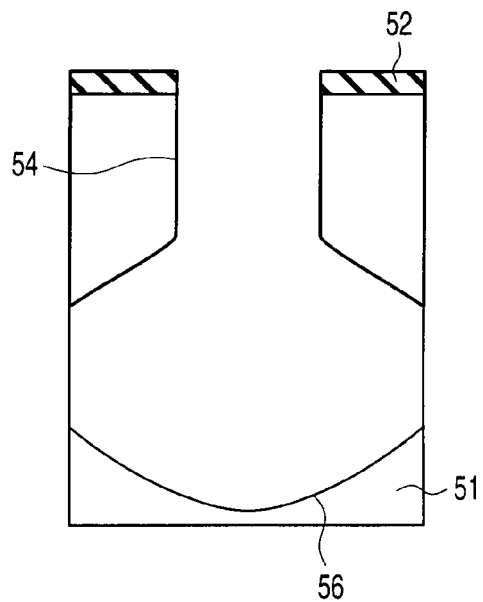
FIG. 32A　　　FIG. 32B

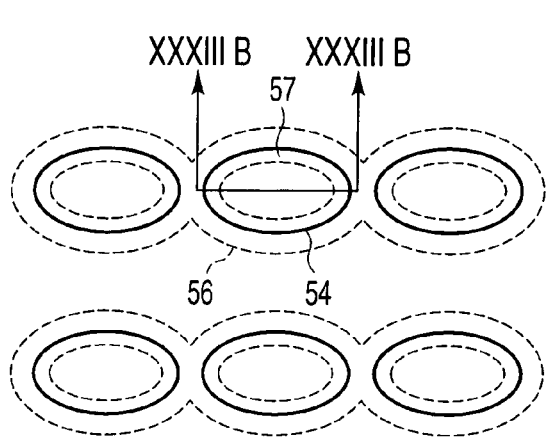
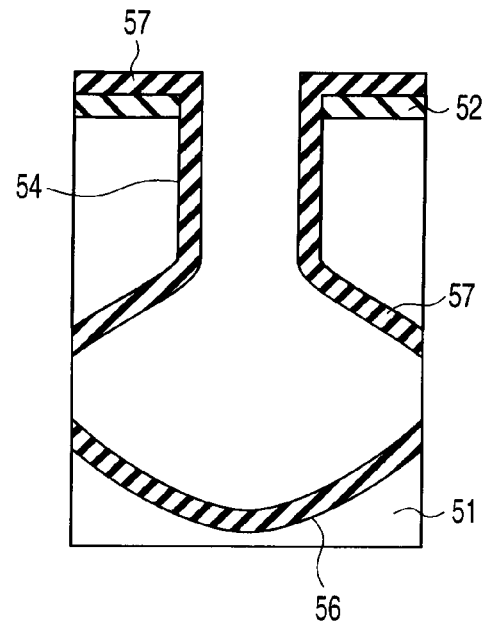
FIG. 33A  FIG. 33B
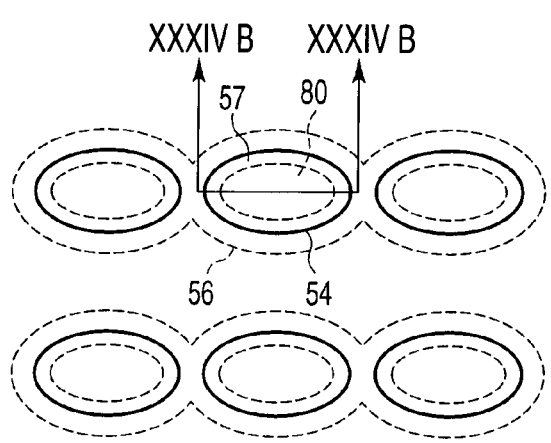
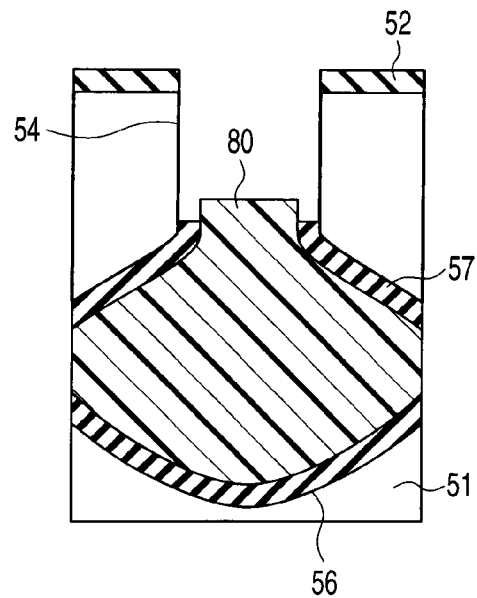
FIG. 34A  FIG. 34B

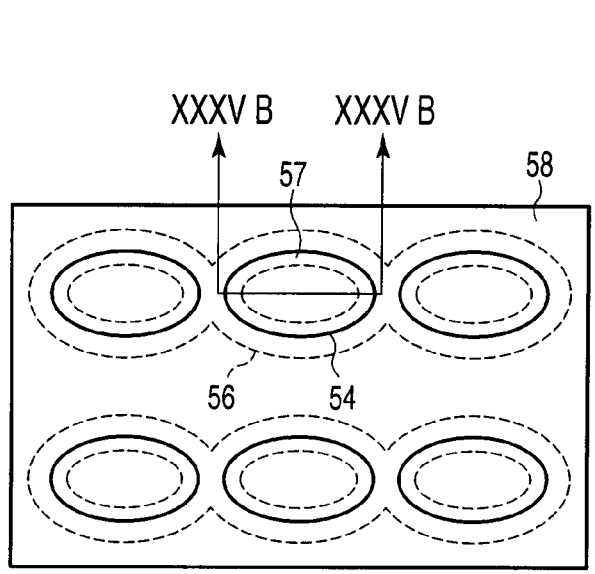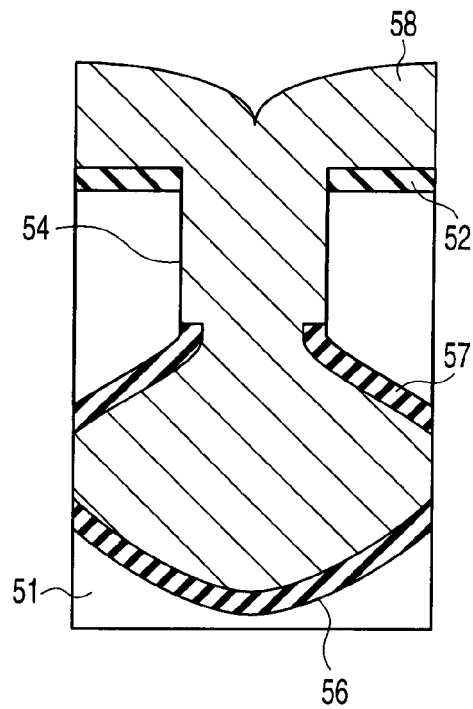
FIG. 35A  FIG. 35B
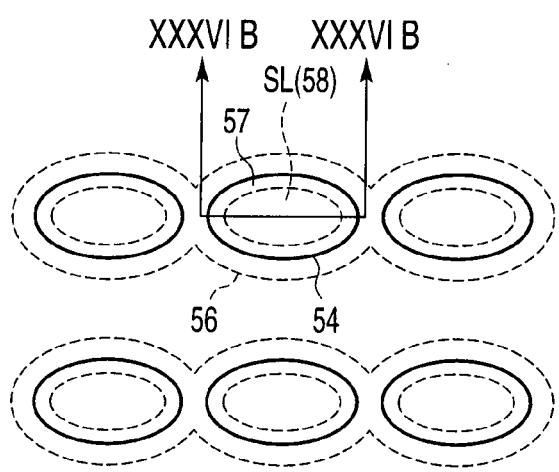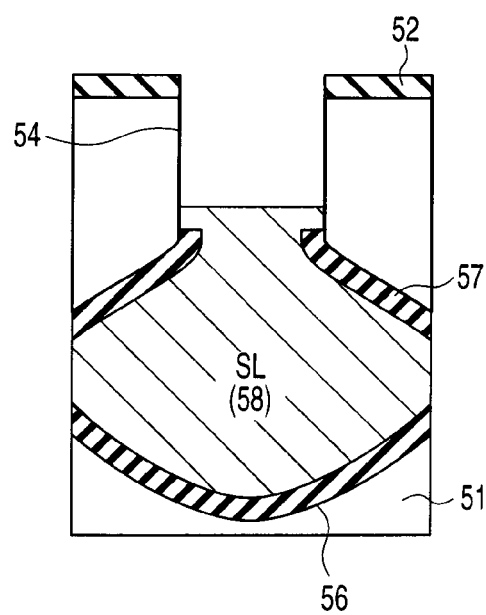
FIG. 36A  FIG. 36B

US 8,009,464 B2

MAGNETIC RANDOM ACCESS MEMORY AND MANUFACTURING METHOD THEREOF

CROSS-REFERENCE TO RELATED APPLICATIONS

This application is based upon and claims the benefit of priority from prior Japanese Patent Application No. 2007-050416, filed Feb. 28, 2007, the entire contents of which are incorporated herein by reference.

BACKGROUND OF THE INVENTION

1. Field of the Invention

The present invention relates to a spin injection magnetization reversal type magnetic random access memory and a manufacturing method thereof.

2. Description of the Related Art

A spin injection magnetization reversal type magnetic random access memory (MRAM) attracts attention as a memory in which information can be written with a low current, and an application as a high-speed RAM enabling high-speed reversal is expected.

When performing an operation at a high speed, a cell to which a voltage is applied must have a minimum bit number to suppress a loss of a charge/discharge time in reading and writing operations. Thus, a source line and a bit line are provided as wiring lines through which a writing current is flowed, and these lines are arranged in the same direction. As a result, the cell to which a voltage is applied becomes minimum, thereby enabling the high-speed operation.

Further, when the number of cells to which a voltage is applied is increased, a leak current is also increased, which leads to a problem of a reduction in a reading signal ratio. Thus, 1MTJ+1Tr must be arranged between the source line and the bit line.

However, when using a planar transistor, a contact which connects a source diffusion layer with the source line and a contact which connects a drain diffusion layer with the bit line must be arranged in a staggered pattern to prevent the source line and the bit line extended in the same direction from being short-circuited. Therefore, there is a problem of an increase in a cell area.

It is to be noted that information of conventional technology documents concerning the present invention is as follows.

[Patent Document 1] JP-A 2004-179489 (KOKAI)
[Patent Document 2] JP-A 2002-208682 (KOKAI)

BRIEF SUMMARY OF THE INVENTION

According to a first aspect of the present invention, there is provided a magnetic random access memory comprising: a semiconductor substrate in which a step portion having a side surface and a top face is formed; a gate electrode formed on the side surface of the step portion through a gate insulating film; a drain diffusion layer formed in the top face of the step portion; a source diffusion layer formed in the semiconductor substrate below the drain diffusion layer to be separated from the drain diffusion layer; a magnetoresistive effect element which is connected with the drain diffusion layer, and has a fixed layer whose magnetization direction is fixed, a recording layer whose magnetization direction is reversible, and a non-magnetic layer provided between the fixed layer and the recording layer, the magnetization directions of the fixed layer and the recording layer entering a parallel state or an antiparallel state in accordance with a direction of a current flowing through a space between the fixed layer and the recording layer; and a bit line connected with the magnetoresistive effect element.

According to a second aspect of the present invention, there is provided a magnetic random access memory manufacturing method comprising: forming an insulating film on a semiconductor substrate; partially removing the semiconductor substrate by using the insulating film as a mask to form a convex portion; forming a source diffusion layer in the semiconductor substrate at the base of the convex portion; forming a gate insulating film on a side surface of the convex portion; forming a gate electrode on the side surface of the convex portion through the gate insulating film; removing the insulating film to expose a top face of the convex portion; forming a drain diffusion layer in the top face of the convex portion; forming a magnetoresistive effect element which is connected with the drain diffusion layer and has a fixed layer whose magnetization direction is fixed, a recording layer whose magnetization direction is reversible, and a non-magnetic layer provided between the fixed layer and the recording layer, the magnetization directions of the fixed layer and the recording layer entering a parallel state or an antiparallel state in accordance with a direction of a current flowing through a space between the fixed layer and the recording layer; and forming a bit line which is connected with the magnetoresistive effect element.

According to a third aspect of the present invention, there is provided a magnetic random access memory manufacturing method comprising: forming a trench in a semiconductor substrate; forming a source line at a lower portion in the trench; forming a source diffusion layer connected with the source line on a side surface of the trench and forming a drain diffusion layer on a surface of the semiconductor substrate; forming a gate electrode on a side surface of an upper portion of the trench through a gate insulating film; forming a magnetoresistive effect element which is connected with the drain diffusion layer and has a fixed layer whose magnetization direction is fixed, a recording layer whose magnetization direction is reversible, and a non-magnetic layer provided between the fixed layer and the recording layer, the magnetization directions of the fixed layer and the recording layer entering a parallel state or an antiparallel state in accordance with a direction of a current flowing through a space between the fixed layer and the recording layer; and forming a bit line which is connected with the magnetoresistive effect element.

BRIEF DESCRIPTION OF THE SEVERAL VIEWS OF THE DRAWING

FIGS. 2A to 2C are plan views showing extending directions of a source line, a bit line, and a word line in FIG. 1A by oblique lines;

FIG. 3A is a plan view of a magnetic random access memory according to a second embodiment of the present invention;

FIG. 3B is a cross-sectional view taken along a line IIIB-IIIB in FIG. 3A;

FIG. 5A is a plan view of a magnetic random access memory according to a third embodiment of the present invention;

FIG. 5B is a cross-sectional view taken along a line VB-VB in FIG. 5A;

FIG. 9A is a plan view showing a manufacturing process of the magnetic random access memory according to the third embodiment of the present invention following FIG. 8A;

FIG. 9B is a cross-sectional view taken alone a line IXB-IXB in FIG. 9A;

FIG. 21 is a cross-sectional view showing a manufacturing process of the magnetic random access memory according to the third embodiment of the present invention following FIG. 20B;

FIG. 22 is a cross-sectional view showing a manufacturing process of the magnetic random access memory according to the third embodiment of the present invention following FIG. 21;

FIG. 27 is a cross-sectional view showing a magnetic random access memory according to a fifth embodiment of the present invention;

FIG. 31A is a plan view of the magnetic random access memory according to the fifth embodiment of the present invention following FIG. 30A;

FIG. 31B is a cross-sectional view taken along a line XXXIB-XXXIB in FIG. 31A;

FIG. 32A is a plan view of the magnetic random access memory according to the fifth embodiment of the present invention following FIG. 31A;

FIG. 32B is a cross-sectional view taken along a line XXXIIB-XXXIIB in FIG. 32A;

FIG. 33A is a plan view of the magnetic random access memory according to the fifth embodiment of the present invention following FIG. 32A;

FIG. 33B is a cross-sectional view taken along a line XXXIIIB-XXXIIIB in FIG. 33A;

FIG. 34A is a plan view of the magnetic random access memory according to the fifth embodiment of the present invention following FIG. 33A;

FIG. 34B is a cross-sectional view taken along a line XXXIVB-XXXIVB in FIG. 34A;

FIG. 35A is a plan view of the magnetic random access memory according to the fifth embodiment of the present invention following FIG. 34A;

FIG. 35B is a cross-sectional view taken along a line XXXVB-XXXVB in FIG. 35A;

FIG. 36A is a plan view of the magnetic random access memory according to the fifth embodiment of the present invention following FIG. 35A;

FIG. 36B is a cross-sectional view taken along a line XXXVIB-XXXVIB in FIG. 36A;

DETAILED DESCRIPTION OF THE INVENTION

Figures 1A, 1B:
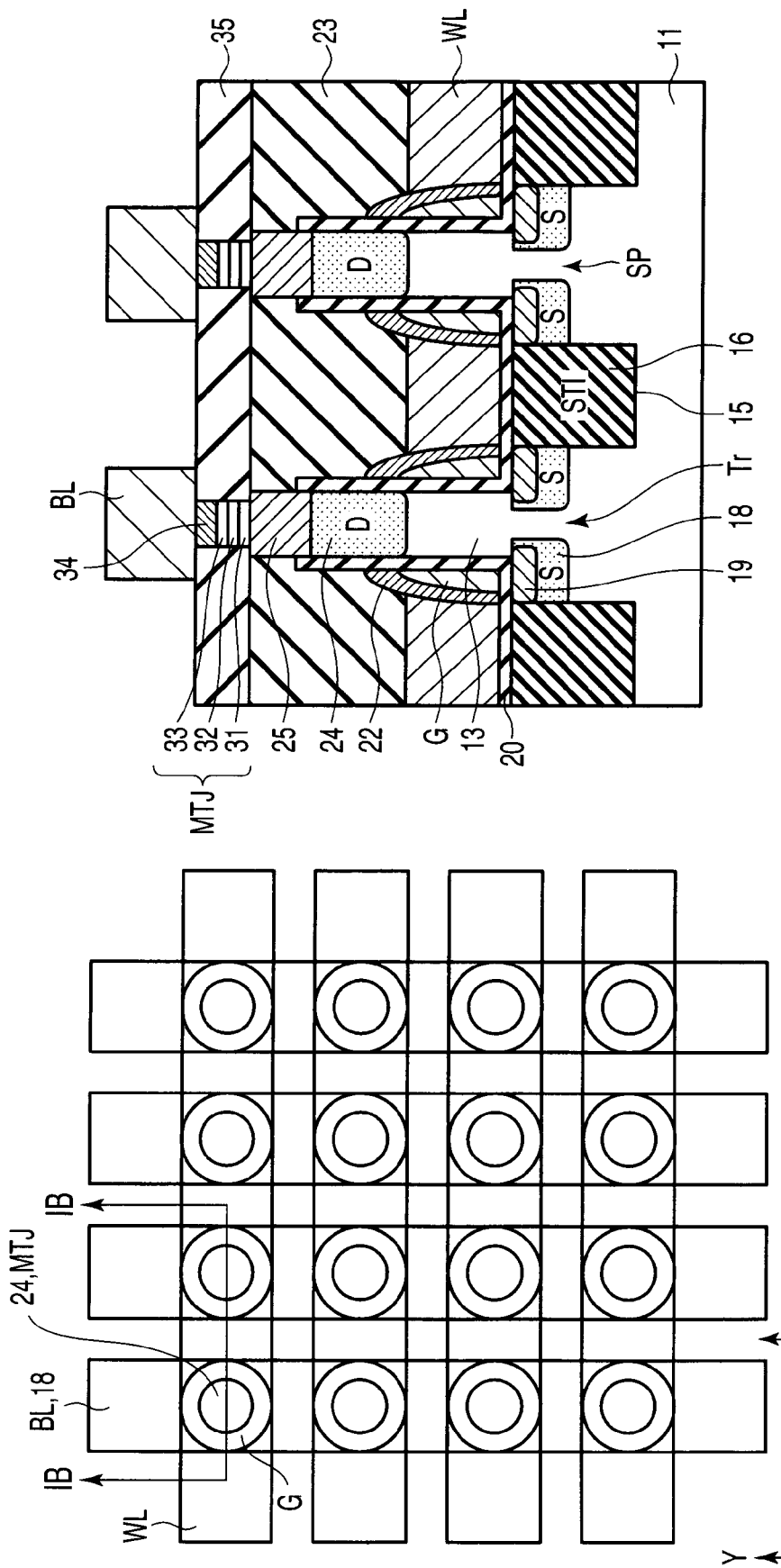
FIG. 1A is a plan view of a magnetic random access memory according to a first embodiment of the present invention.
FIG. 1B is a cross-sectional view taken along a line IB-IB in FIG. 1A.

Embodiments according to the present invention will now be explained hereinafter with reference to the accompanying drawings. In this explanation, like reference numerals denote like parts throughout the drawings.

In the following first to fifth embodiments, a magnetic random access memory (MRAM) in which a vertical transistor is formed at a step portion of a substrate in a 1Tr+1MTJ cell will be explained. Here, an example where a vertical transistor is formed at a convex step portion will be explained in the first to fourth embodiments, and an example where a vertical transistor is formed at a concave step portion will be explained in the fifth embodiment.

In the following sixth embodiment, an MTJ (Magnetic Tunnel Junction) element as a magnetoresistive effect element used in the magnetic random access memory in each embodiment will be explained.

[1] First Embodiment

[1-1] Structure

The first embodiment is an example where a bit line and a source line (a source diffusion layer) arranged above and below a vertical transistor are extended in the same direction.

FIG. 1A is a plan view of a magnetic random access memory according to the first embodiment of the present invention. FIG. 1B is a cross-sectional view taken along a line IB-IB in FIG. 1A. FIGS. 2A to 2C are plan views showing extending directions of a source line, a bit line, and a word line by oblique lines. A structure of the magnetic random access memory according to the first embodiment will now be explained hereinafter.

As shown in FIGS. 1A and 1B, element isolation insulating films 16 each having an STI (Shallow Trench Isolation) structure are formed in a semiconductor substrate (a silicon substrate) 11. This element isolation insulating film 16 is linearly extended in, e.g., a Y direction. Convex portions (silicon columns) 13 protruding from a substrate surface are formed in an element region of the semiconductor substrate 11. This convex portion 13 has, e.g., a columnar shape. The convex portion 13 has a side surface and a top face placed above the substrate surface. This convex portion 13 serves as a channel region of a vertical transistor (e.g., an MOSFET) Tr. The top face of the convex portion 13 is placed above a top face of the element isolation insulating film 16.

A gate insulating film 20 is continuously formed on the side surface of each convex portion 13 and on the semiconductor substrate 11. A gate electrode G is formed on the side surface of each convex portion 13 through the gate insulating film 20. A planar shape of this gate electrode G is a ring-like shape surrounding the side surface of the convex portion 13. It is desirable for a top face of the gate electrode G to be lower than the top face of the convex portion 13. In order to reduce a resistance of the gate electrode G to realize a high-speed operation, it is desirable to form the gate electrode G by using a metal material or form a silicide layer 22 on the gate electrode G.

A drain diffusion layer (D) 24 is formed in the top face of each convex portion 13. A source diffusion layer (S) 18 is formed in the semiconductor substrate 11 at the base of each convex portion 13. This source diffusion layer 18 is divided in a region below the drain diffusion layer 24, thereby forming a space SP. This structure is adopted to enable application of a back gate voltage to the transistor Tr in order to stabilize a circuit because holes and others are accumulated to affect transistor characteristics when the channel region enters a floating state. In order to reduce a resistance of the source diffusion layer 18 to realize a high-speed operation, forming a silicide layer 19 on each source diffusion layer 18 is desirable.

Each word line WL extended in an X direction is formed on the semiconductor substrate 11. This word line WL electrically connects the gate electrodes G adjacent to each other in the X direction. A top face of each word line WL is lower than the top face of each convex portion 13.

A contact 25 is formed on each drain diffusion layer 24. The gate insulating film 20 may be or may not be present on a side surface of this contact 25 as long as the contact 25 is prevented from being short-circuited with the gate electrode G and the word line WL. A planar shape of the contact 25 is the same as, e.g., the planar shape of the top face of the convex portion 13.

An MTJ (Magnetic Tunnel Junction) element MTJ1 is arranged on each contact 25. Therefore, the MTJ element is arranged immediately above the convex portion 13. The MTJ element MTJ has a laminated structure in which a fixed layer (a pin layer) 31, a non-magnetic layer 32, and a recording layer (a free layer) 33 are sequentially laminated. It is to be noted that the fixing layer 31 may be counterchanged with the recording layer 33 to arrange the recording layer 33 on the contact 25 side.

A contact 34 is connected with a top face of each MTJ element MTJ. A planar shape of this contact 34 is the same as, e.g., the planar shape of the MTJ element MTJ. Each bit line BL extended in the Y direction is connected with the upper side of the contact 34.

In such a structure, as shown in FIGS. 2A to 2C, each source line SL (the source diffusion layer 18) is extended in the Y direction, each bit line BL is extended in the Y direction, and each word line WL is extended in the X direction. Therefore, the bit line BL and the source line SL are extended in the same direction, and the bit line BL and the word line WL are extended in different directions (e.g., directions crossing each other).

Here, each source line SL is shared by cells which are adjacent to each other in the Y direction, extended to an end portion of a memory cell array, and connected with a source contact (not shown) at this end portion. Each bit line BL is shared by cells which are adjacent to each other in the Y direction, extended to the end portion of the memory cell array, and connected with a bit line contact (not shown) at this end portion. A power supply terminal and a ground terminal are respectively connected with both ends of the bit line BL so that a current can flow in both directions. Each word line WL is shared by cells which are adjacent to each other in the X direction, extended to the end portion of the memory cell array, and connected with the gate contact (not shown) at this end portion.

[1-2] Writing Operation

In the magnetic random access memory according to an embodiment of the present invention, data writing using spin injection magnetization reversal is executed.

In this embodiment, the vertical transistor Tr of a selected cell is turned on to flow a current I to a space between the bit line BL and the source diffusion layer 18. As a result, in the MTJ element MTJ, magnetization directions of the fixed layer 31 and the recording layer 33 enter a parallel state or an anti-parallel state in accordance with a direction of the current I flowing through the space between the fixed layer 31 and the recording layer 33. Specifically, the following operation is performed.

When writing data "1", the current I is flowed in a direction from the fixed layer 31 to the recording layer 33 in the MTJ element MTJ. That is, an electron e is injected from the recording layer 33 side to the fixed layer 31 side. As a result, magnetizations of the fixed layer 31 and the recording layer 33 face opposite directions and enter the anti-parallel state. This high-resistance state Rap is defined as data "1".

On the other hand, when writing data "0", the current I is flowed in a direction from the recording layer 33 to the fixed layer 31 in the MTJ element MTJ. That is, the electron e is injected from the fixed layer 31 side to the recording layer 33 side. As a result, the magnetizations of the fixed layer 31 and the recording layer 33 face the same direction, and enter the parallel state. This low-resistance state Rp is defined as data "0".

[1-3] Reading Operation

In a reading operation according to the first embodiment, a magnetoresistive effect is utilized.

The transistor Tr coupled with the MTJ element MTJ in a selected cell is turned on, and a reading current is flowed in, e.g., a direction from the bit line BL to the transistor Tr through the MTJ element MTJ. Further, a judgment is made upon whether data is "1" or "0" by using a resistance value of the MTJ element MTJ read based on this reading current.

It is to be noted that, in the reading operation, a constant voltage may be applied to read a current value, or a constant current may be applied to read a voltage value.

[1-4] Effect

According to the first embodiment, each convex portion 13 is formed on the semiconductor substrate 11, the drain diffusion layer 24 is formed on the top face of the convex portion 13, and the source diffusion layer 18 is formed at the base of the convex portion 13. As a result, the vertical transistor Tr having the convex portion 13 as the channel region is formed. Here, in this embodiment, the source diffusion layer 18 is formed in the semiconductor substrate 11 without forming a source metal wiring line like a conventional example. Further, the bit line BL is formed above this source diffusion layer 18, and this bit line BL is extended in the same direction as the source diffusion layer 18. Therefore, the bit line BL and the source line SL (the source diffusion layer 18) can be formed in such a manner that they overlap each other in parallel. Therefore, the bit line, the source line, and the contacts connected with these lines do not have to be arranged in a staggered pattern like the conventional example, and a cell area can be reduced, thereby realizing a cell area of $4F^2$ (F: a minimum processing dimension)+α.

[2] Second Embodiment

The second embodiment is an example in which the extending direction of the bit line BL in the first embodiment is opposite to the extending direction of the word line WL in the same. It is to be noted that, in the second embodiment, an explanation on the same points as those in the first embodiment will be omitted.

[2-1] Structure

Figures 4A, 4B, 4C:
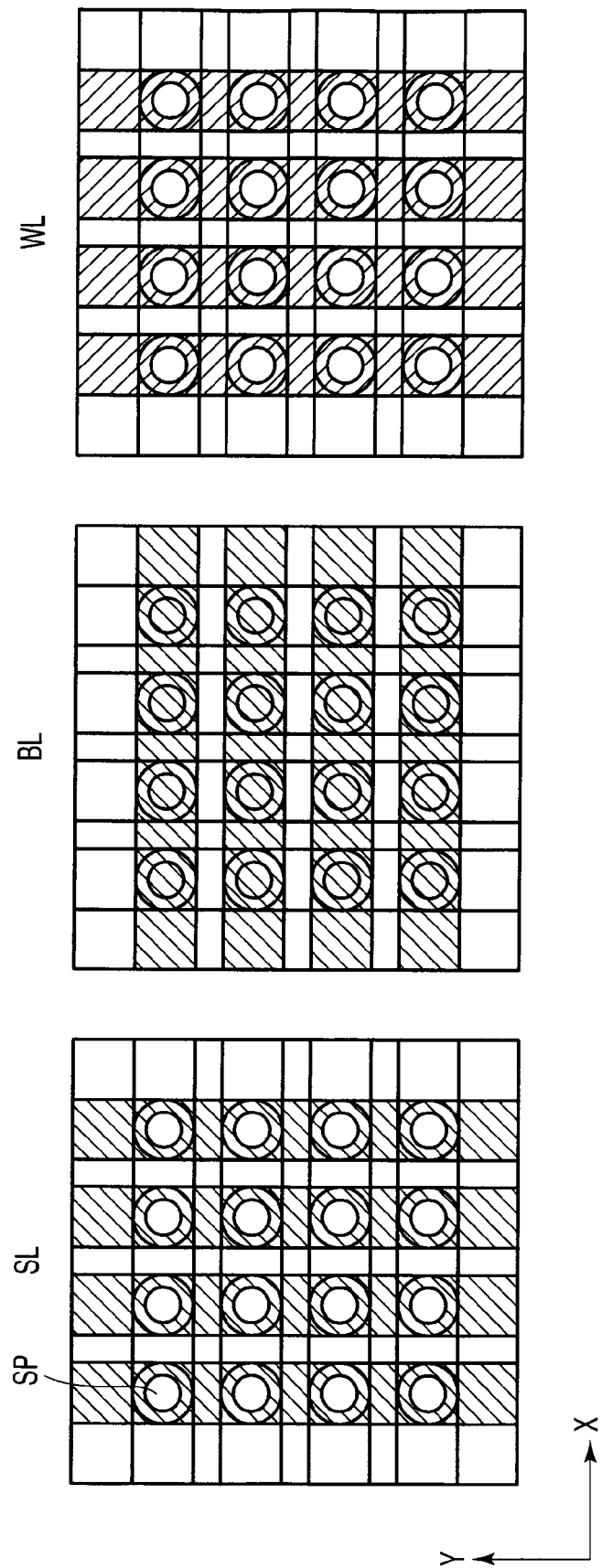
FIGS. 4A to 4C are plan views showing extending directions of a source line, a bit line, and a word line in FIG. 3A by oblique lines.

FIG. 3A is a plan view of a magnetic random access memory according to the second embodiment of the present invention. FIG. 3B is a cross-sectional view taken along a line IIIB-IIIB in FIG. 3A. FIGS. 4A to 4C are plan views showing extending directions of a source line, a bit line, and a word line in FIG. 3A by oblique lines. A structure of the magnetic random access memory according to the second embodiment will now be explained.

As shown in FIGS. 3A and 3B, the second embodiment is different from the first embodiment in that an extending direction of a source diffusion layer 13 is different from an extending direction of a bit line BL. Therefore, in the second embodiment, as shown in FIGS. 4A to 4C, each source line SL (the source diffusion layer 18) is extended in a Y direction, each bit line BL is extended in an X direction, and each word line WL is extended in the Y direction. Therefore, the source line SL and the bit line BL are extended in the different directions, and the source line SL and the word line WL are extended in the same direction. Here, the source line SL is shared by cells which are adjacent to each other in the Y direction, the bit line BL is shared by cells which are adjacent to each other in the X direction, and the word line WL is shared by cells which are adjacent to each other in the Y direction.

[2-2] Effect

According to the second embodiment, like the first embodiment, a vertical transistor Tr is formed. Here, in this embodiment, the word line WL and the source line SL (the source diffusion layer 18) can be formed in such a manner that they overlap each other in parallel. Therefore, two contacts connected with the source diffusion layer and a drain diffusion layer and a gate wiring line do not have to be aligned on a planar surface, thereby reducing a cell area as compared with a conventional planar transistor.

It is to be noted that a structure in which each bit line BL and each source line SL are arranged in parallel like the first embodiment is desirable in order to meet a request for a high-speed operation, suppress an increase in the number of cells to which a voltage is applied, and suppress an increase in a leak current, but the second embodiment has an advantage that a degree of freedom in enabling arranging a circuit at an array end portion in the extending direction of the word line WL is increased.

[3] Third Embodiment

The third embodiment is a modification of the gate electrode and the word line in the first embodiment. It is to be noted that, in the third embodiment, an explanation on the same points as those in the first embodiment will be omitted.

[3-1] Structure

FIG. 5A is a plan view of a magnetic random access memory according to the third embodiment of the present invention. FIG. 5B is a cross-sectional view taken along a line VB-VB in FIG. 5A. A structure of the magnetic random access memory according to the fifth embodiment will now be explained hereinafter.

As shown in FIGS. 5A and 5B, the third embodiment is different from the first embodiment in that each gate electrode G functions as each word line WL without forming the word line WL separately from the gate electrode G. That is, the gate electrodes G which are adjacent to each other in an X direction are brought into contact with each other, and the gate electrodes G are extended in the X direction. Further, a silicide layer 22 is formed on each gate electrode G, and this silicide layer 22 is also extended in the X direction.

[3-2] Manufacturing Method

FIGS. 6A and 6B to FIG. 25 are manufacturing process drawings of the magnetic random access memory according to the third embodiment of the present invention. It is to be noted that, in FIGS. 6A and 6B to FIGS. 20A and 20B, each FIG. A is a plan view and each FIG. B is a cross-sectional view. FIGS. 21 to 25 are cross-sectional views alone. A manufacturing method of the magnetic random access memory according to the third embodiment will now be explained hereinafter.

Figure 6B:
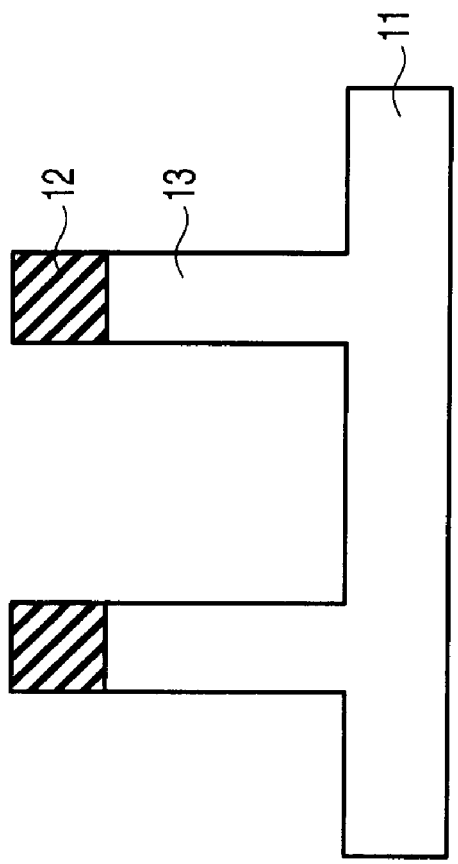
FIG. 6B is a cross-sectional view taken along a line VIB-VIB in FIG. 6A.
Figure 6A:
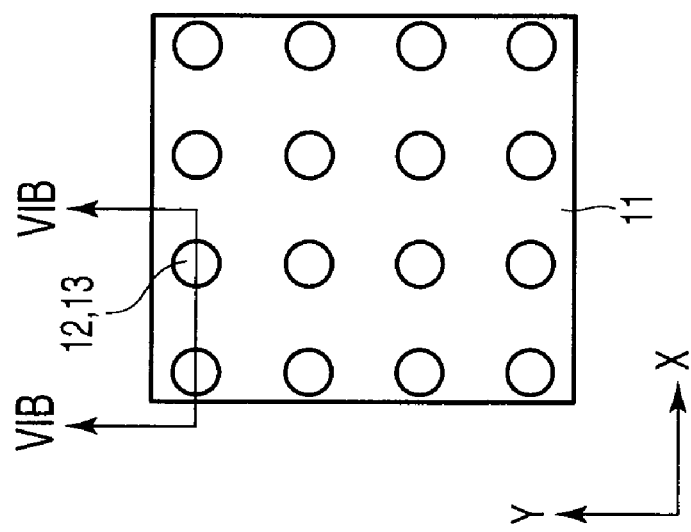
FIG. 6A is a plan view showing a manufacturing process of the magnetic random access memory according to the third embodiment of the present invention.

First, as shown in FIGS. 6A and 6B, a silicon nitride film 12 is deposited on a semiconductor substrate (a silicon substrate) 11, and this silicon nitride film 12 is patterned. Then, the semiconductor substrate 11 is etched based on RIE (Reactive Ion Etching) with the silicon nitride film 12 being used as a mask, thereby forming each convex portion (a silicon column) 13 serving as a channel region.

Figure 7B:
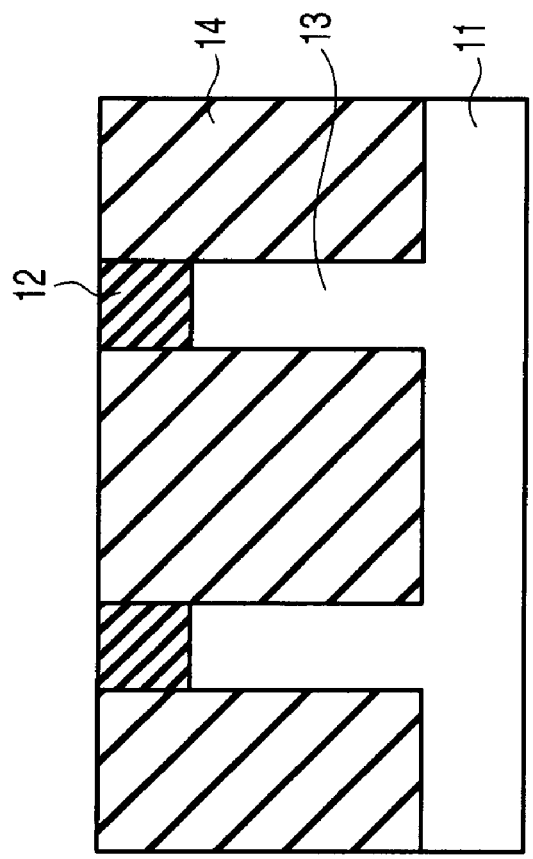
FIG. 7B is a cross-sectional view taken along a line VIIB-VIIB in FIG. 7A.
Figure 7A:
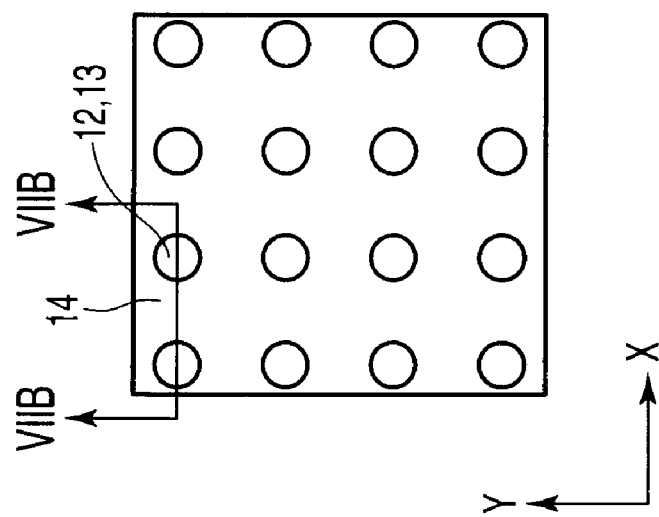
FIG. 7A is a plan view showing a manufacturing process of the magnetic random access memory according to the third embodiment of the present invention.

Then, as shown in FIGS. 7A and 7B, an insulating film 14 formed of, e.g., a silicon oxide film is deposited around each convex portion 13 and on each silicon nitride film 12, and this insulating film 14 is flattened based on CMP (Chemical Mechanical Polishing). As a result, each silicon nitride film 12 is exposed.

Figure 8B:
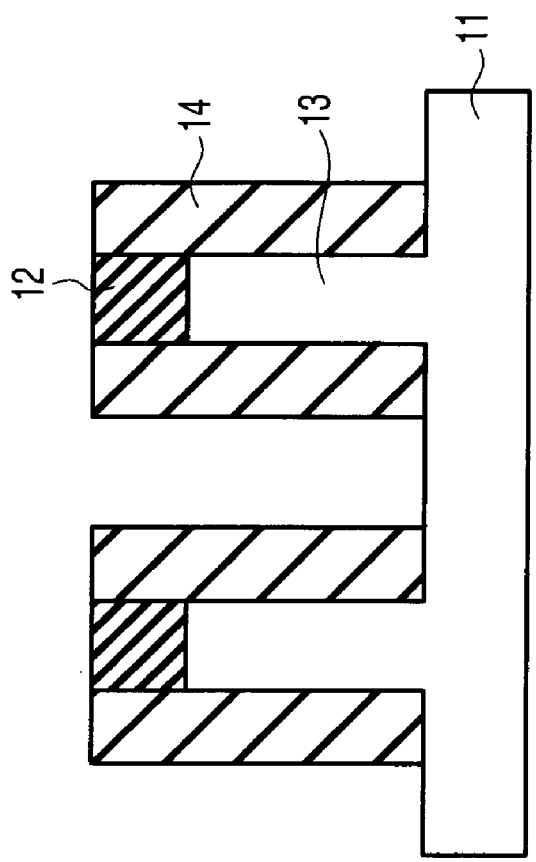
FIG. 8B is a cross-sectional view taken along a line VIIIB-VIIIB in FIG. 8A.
Figure 8A:
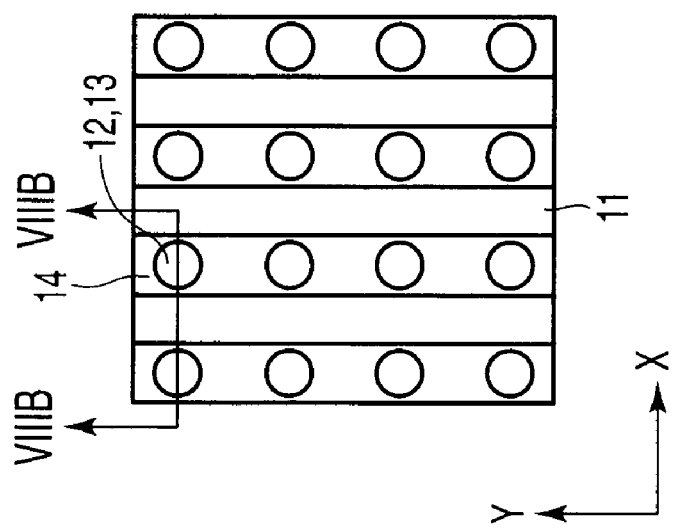
FIG. 8A is a plan view showing a manufacturing process of the magnetic random access memory according to the third embodiment of the present invention following FIG. 7A.

Subsequently, as shown in FIGS. 8A and 8B, the insulating film 14 is patterned based on lithography and RIE, thereby partially exposing the semiconductor substrate 11. As a result, the linear insulating film 14 is formed around the respective convex portions 13.

Then, as shown in FIGS. 9A and 9B, the semiconductor substrate 11 in regions which are not covered with the insulating film 14 is etched based on RIE. As a result, linear element isolation grooves 15 are formed.

Figure 10B:
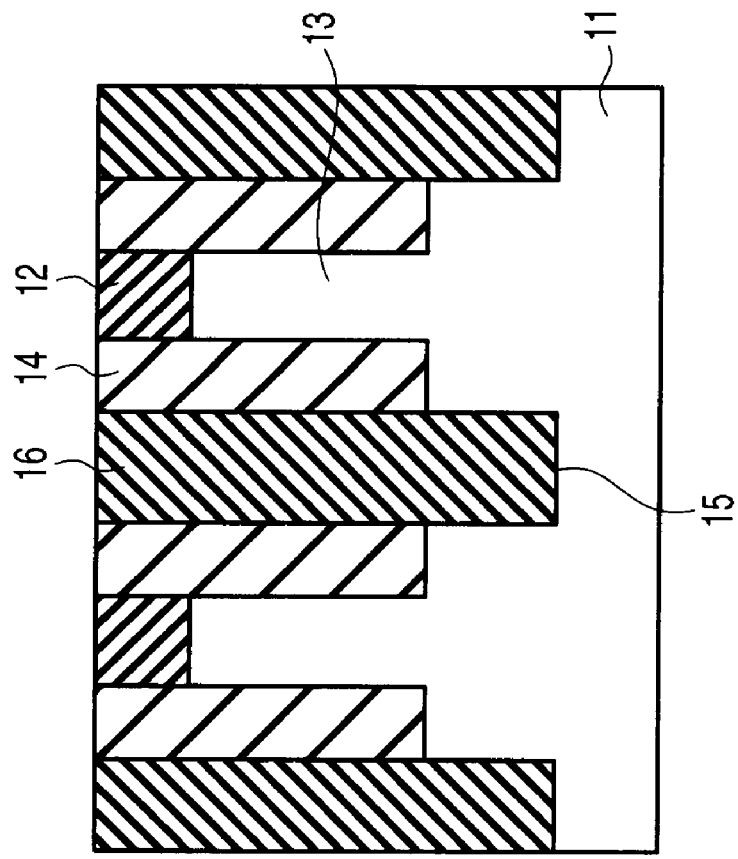
FIG. 10B is a cross-sectional view taken along a line X-X in FIG. 10A.
Figure 10A:
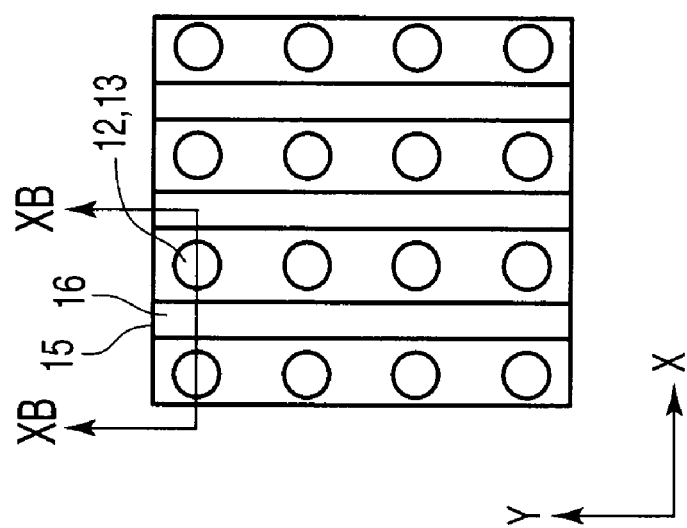
FIG. 10A is a plan view showing a manufacturing process of the magnetic random access memory according to the third embodiment of the present invention following FIG. 9A.

Subsequently, as shown in FIGS. 10A and 10B, each element isolation groove 15 is filled with an oxidized type element isolation insulating film 16, e.g., a silicon oxide film. Here, it is desirable for the element isolation insulating film 16 to be formed of the same material as the insulating film 14 in order to facilitate a later-explained etching process in FIG. 11.

Figure 11B:
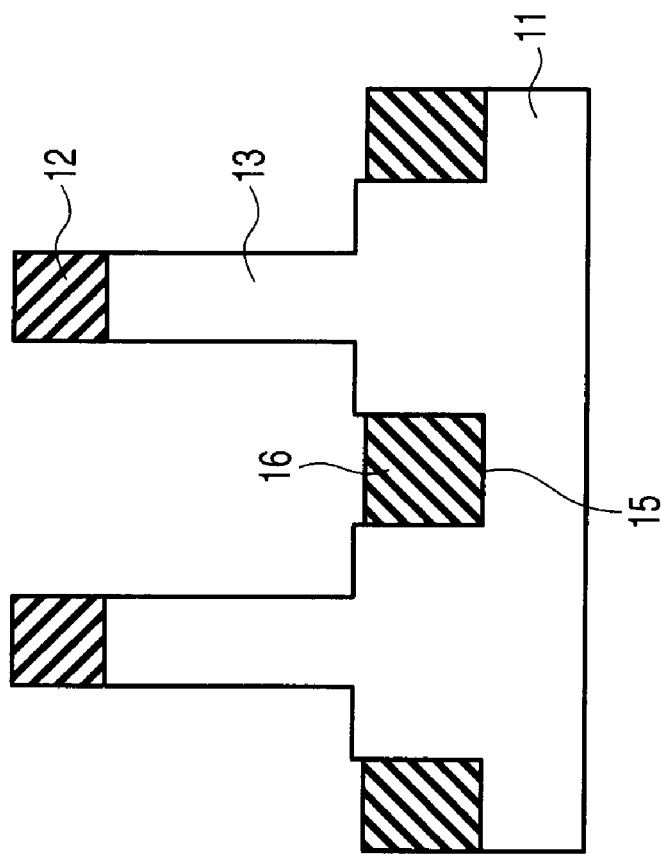
FIG. 11B is a cross-sectional view taken along a line XIB-XIB in FIG. 11A.
Figure 11A:
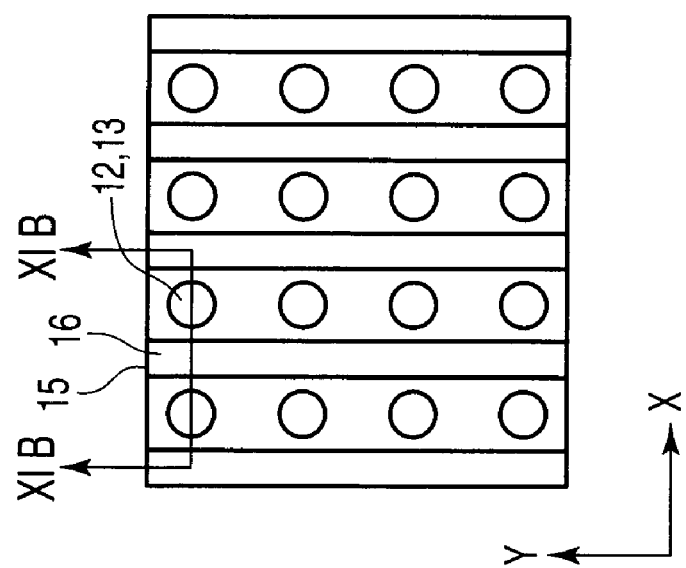
FIG. 11A is a plan view showing a manufacturing process of the magnetic random access memory according to the third embodiment of the present invention following FIG. 10A.

Then, as shown in FIGS. 11A and 11B, the insulating film 14 and the element isolation insulating film 16 are removed based on isotropic etching so that the element isolation insulating film 16 remains in each element isolation groove 15 alone. As a result, each element isolation region having a linear STI structure is formed.

Figure 12B:
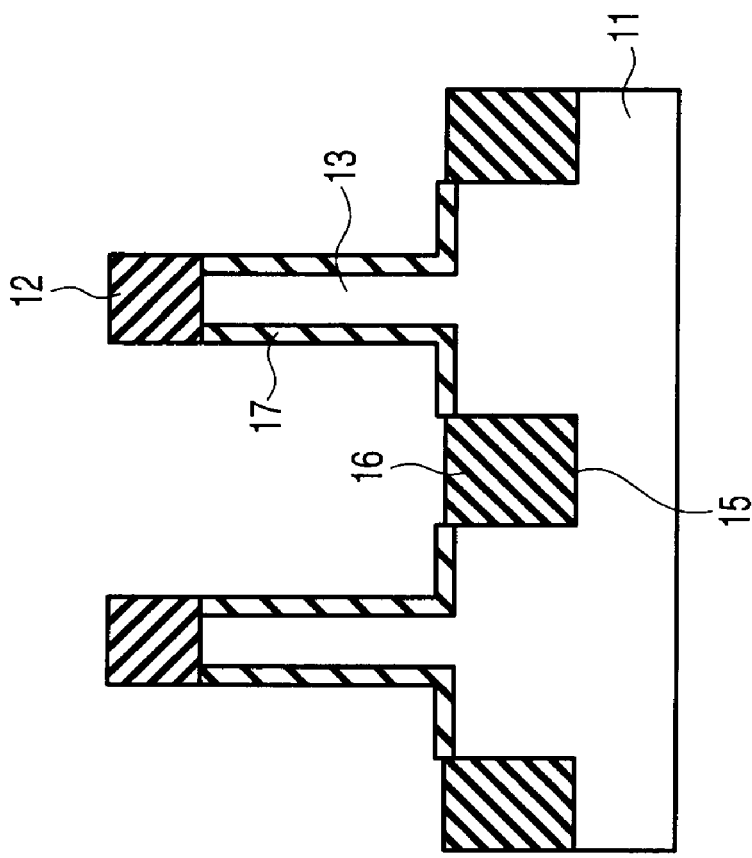
FIG. 12B is a cross-sectional view taken along a line XIIB-XIIB in FIG. 12A.
Figure 12A:
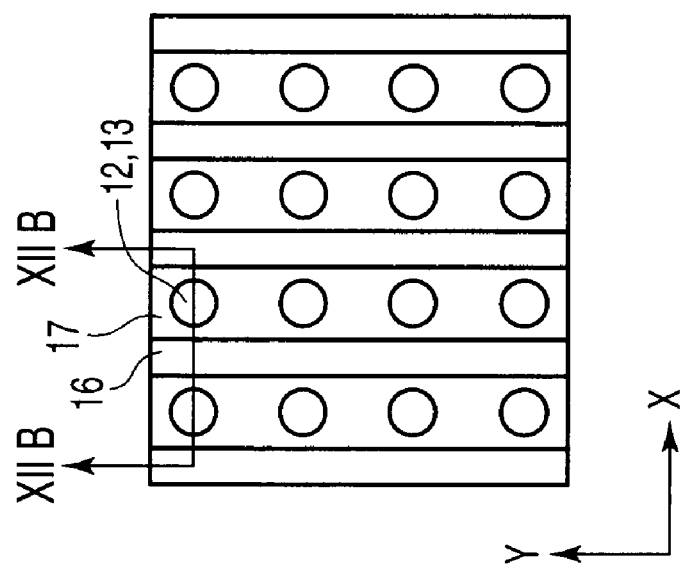
FIG. 12A is a plan view showing a manufacturing process of the magnetic random access memory according to the third embodiment of the present invention following FIG. 11A.

Subsequently, as shown in FIGS. 12A and 12B, a sacrificial oxide film 17 is formed on an exposed surface of the semiconductor substrate 11, e.g., a side surface and a base of each convex portion 13 by oxidation.

Figure 13B:
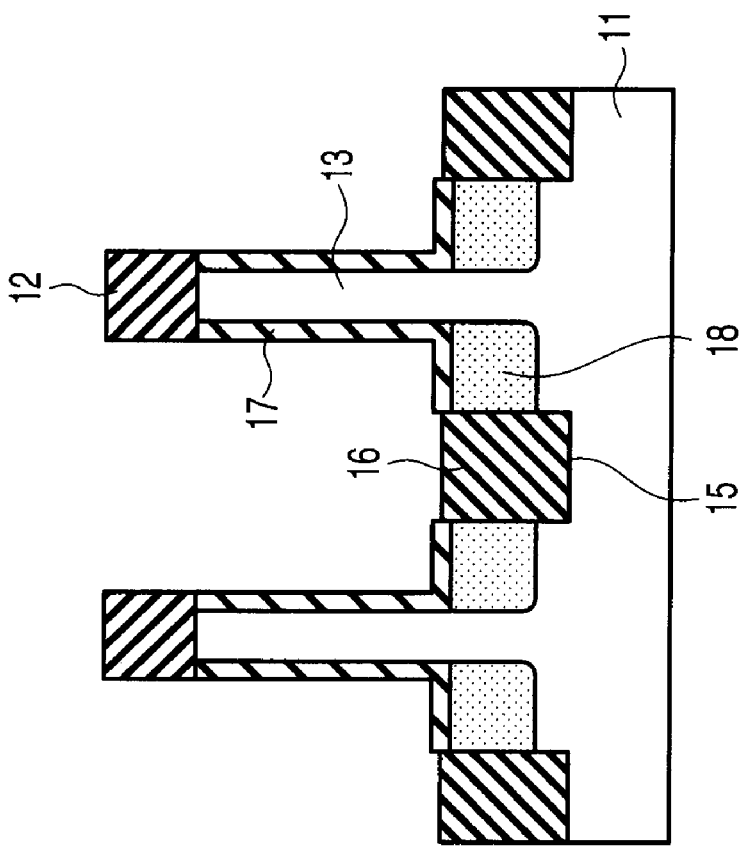
FIG. 13B is a cross-sectional view taken along a line XIIIB-XIIIB in FIG. 13A.
Figure 13A:
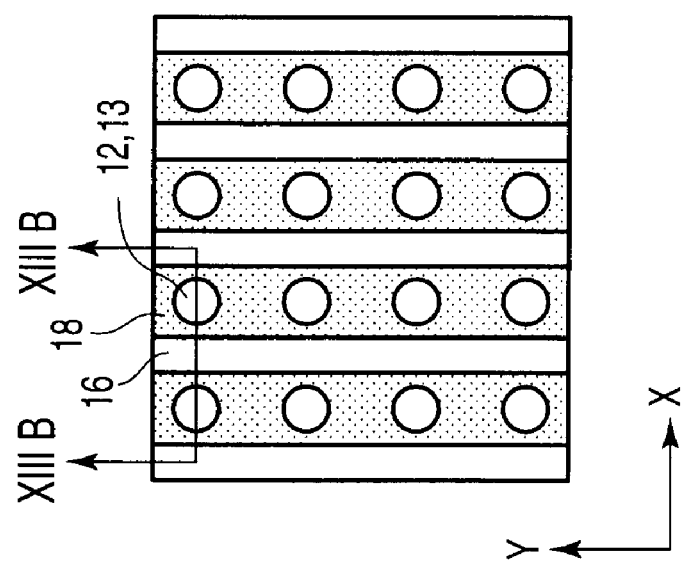
FIG. 13A is a plan view showing a manufacturing process of the magnetic random access memory according to the third embodiment of the present invention following FIG. 12A.

Then, as shown in FIGS. 13A and 13B, a source diffusion layer 18 having a high concentration is formed in the semiconductor substrate 11 at the base of each convex portion 13 by ion implantation and a heat treatment.

Figure 14B:
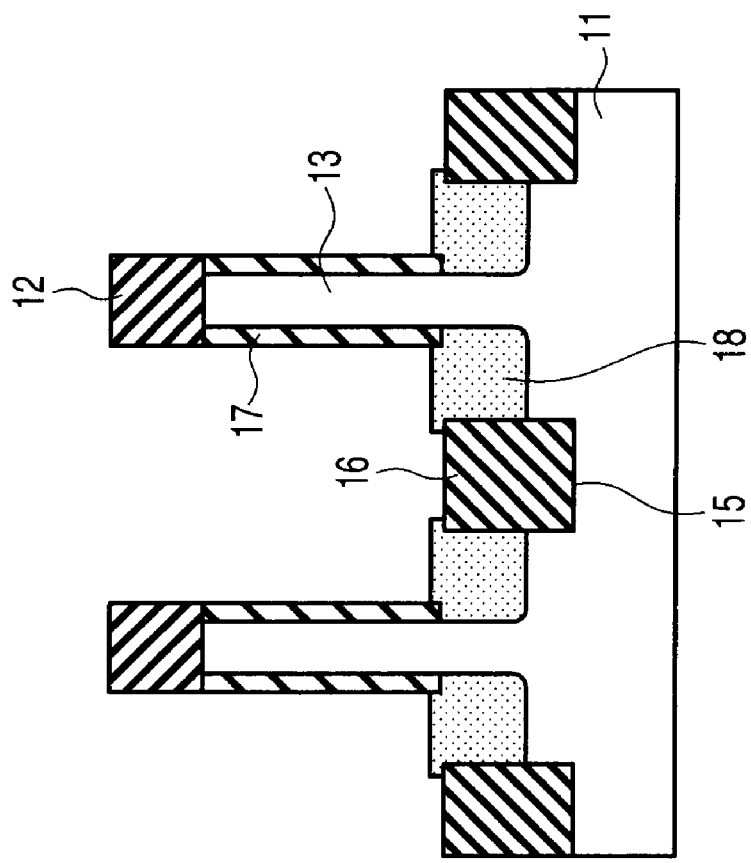
FIG. 14B is a cross-sectional view taken along a line XIVB-XIVB in FIG. 14A.
Figure 14A:
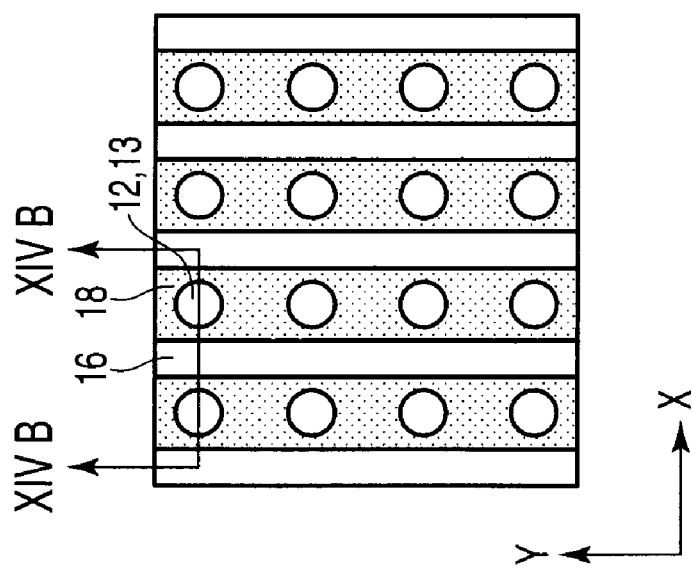
FIG. 14A is a plan view showing a manufacturing process of the magnetic random access memory according to the third embodiment of the present invention following FIG. 13A.

Subsequently, as shown in FIGS. 14A and 14B, the sacrificial oxide film 17 on each source diffusion layer 18 is removed by RIE. At this time, the sacrificial oxide film 17 on the side surface of each convex portion 13 is left.

Figure 15A:
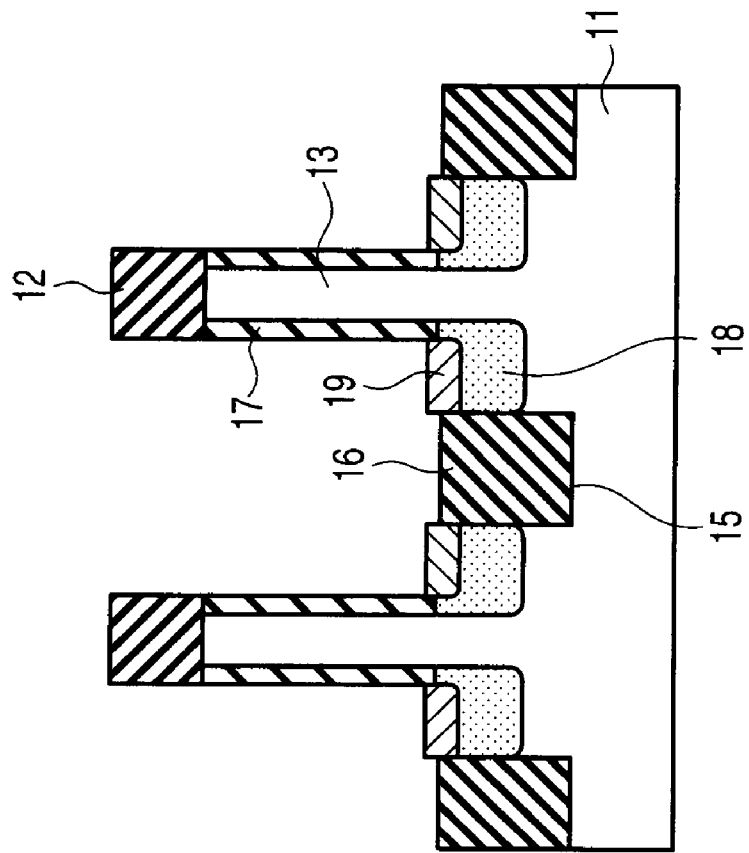
FIG. 15A is a plan view showing a manufacturing process of the magnetic random access memory according to the third embodiment of the present invention following FIG. 14B.
Figure 15B:
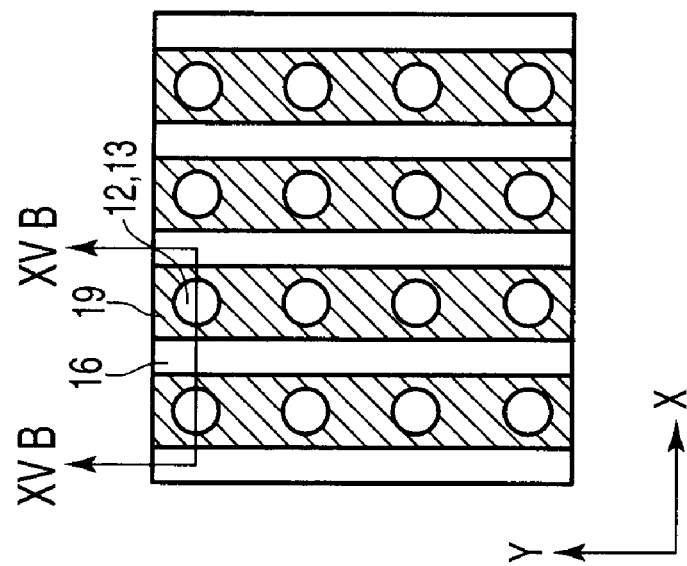
FIG. 15B is a cross-sectional view taken along a line XVB-XVB in FIG. 15A.

Then, as shown in FIGS. 15A and 15B, a refractory metal is deposited on the semiconductor substrate 11, and this refractory metal is reacted with silicon. Thereafter, an unreacted refractory metal is removed. As a result, a silicide layer 19 is formed on each source diffusion layer 18. As the silicide layer 19, there is, e.g., a tungsten silicide (WSi), a molybdenum silicide (MoSi), a tantalum silicide (TaSi), a titanium silicide (TiSi), a cobalt silicide (CoSi), a nickel silicide (NiSi), or a platinum silicide (PtSi).

Figure 16B:
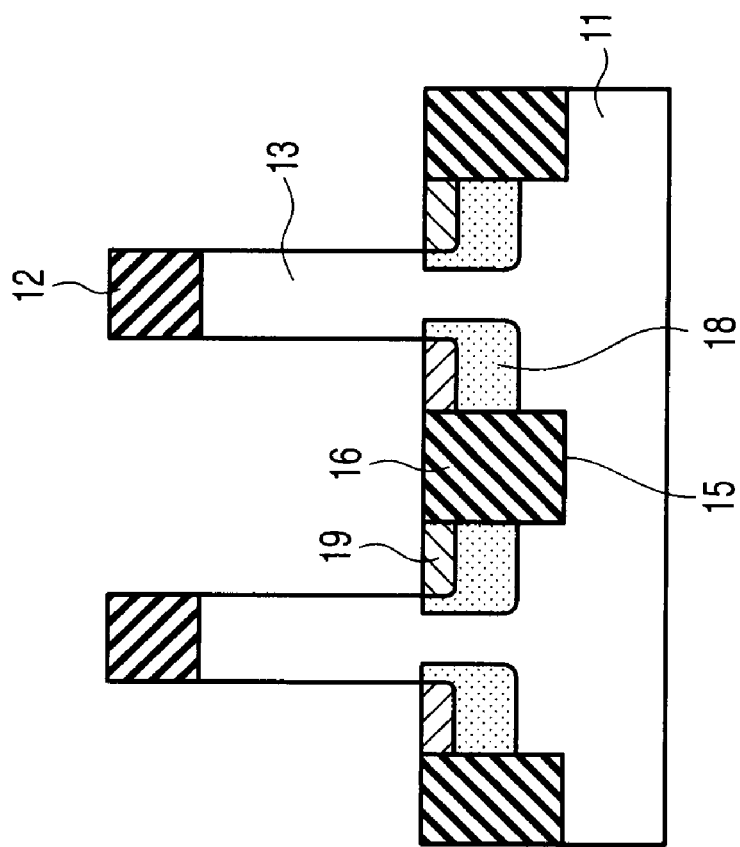
FIG. 16B is a cross-sectional view taken along a line XVIB-XVIB in FIG. 16A.
Figure 16A:
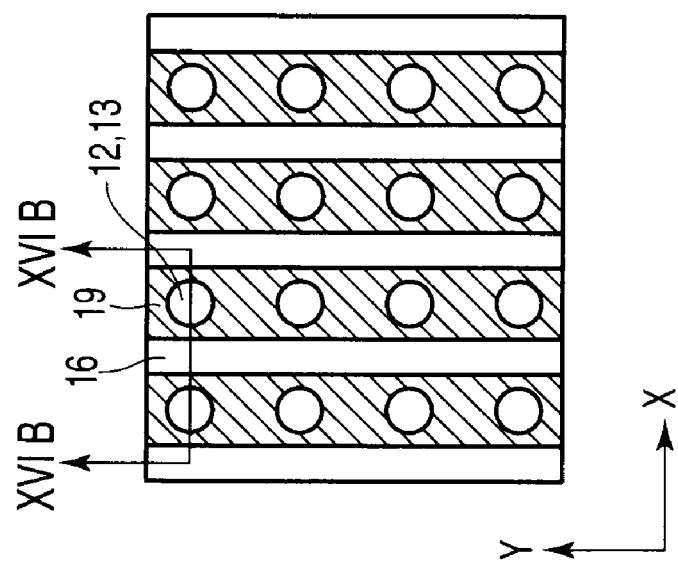
FIG. 16A is a plan view showing a manufacturing process of the magnetic random access memory according to the third embodiment of the present invention following FIG. 15A.

Subsequently, as shown in FIGS. 16A and 16B, the sacrificial oxide film 17 on the side surface of each convex portion 13 is removed.

Figure 17B:
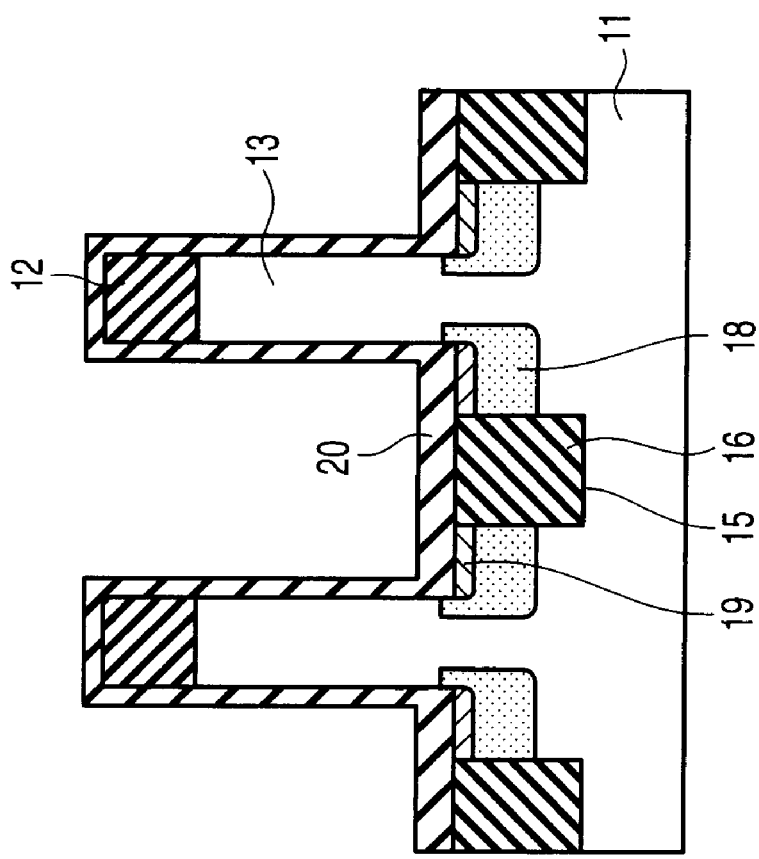
FIG. 17B is a cross-sectional view taken along a line XVIIB-XVIIB in FIG. 17A.
Figure 17A:
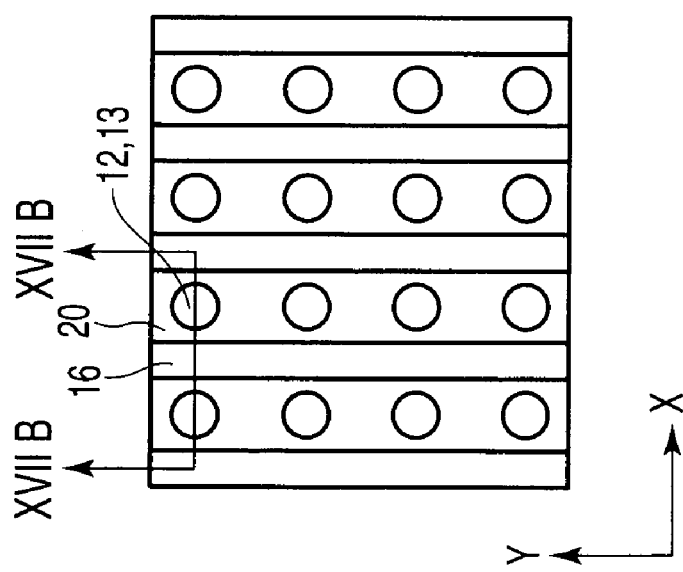
FIG. 17A is a plan view showing a manufacturing process of the magnetic random access memory according to the third embodiment of the present invention following FIG. 16A.

Then, as shown in FIGS. 17A and 17B, a gate insulating film 20 is deposited on the semiconductor substrate 11, the element isolation insulating film 16, and the silicon nitride film 12.

Figure 18B:
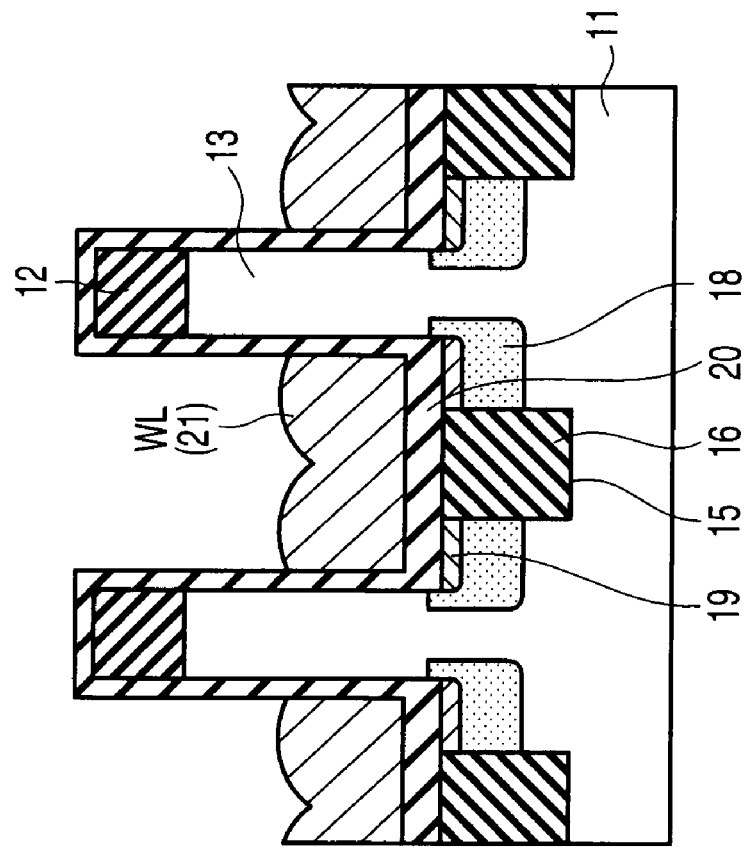
FIG. 18B is a cross-sectional view taken along a line XVIIIB-XVIIIB in FIG. 18A.
Figure 18A:
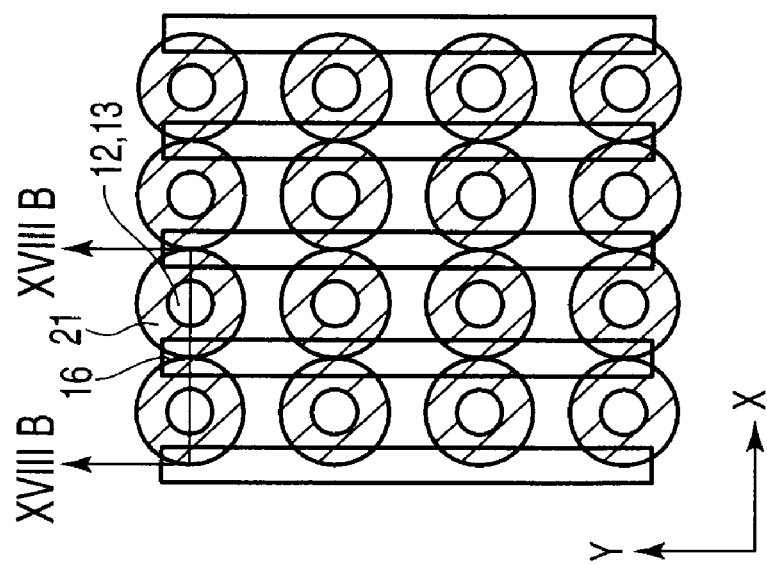
FIG. 18A is a plan view showing a manufacturing process of the magnetic random access memory according to the third embodiment of the present invention following FIG. 17A.

Subsequently, as shown in FIGS. 18A and 18B, an electroconductive material 21 formed of, e.g., polysilicon is deposited. The electroconductive material 21 on the upper side of each convex portion 13 is removed. At this time, the electroconductive material 21 is left to prevent a gap from being formed between the convex portions 13 which are adjacent to each other in the X direction. As a result, each word line WL extended in the X direction is formed. This word line WL functions as a gate electrode G.

Figure 19B:
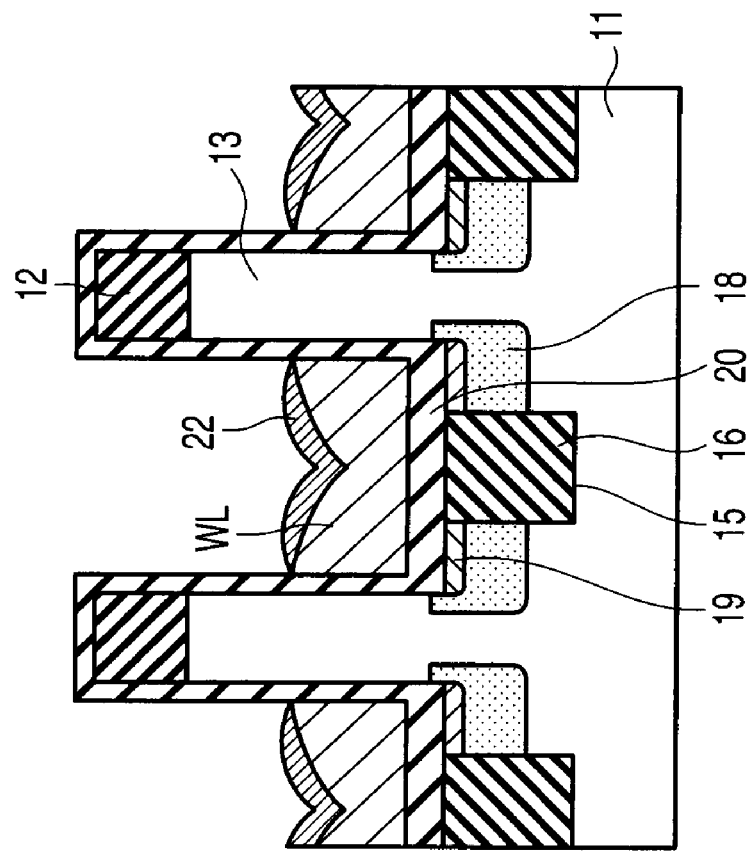
FIG. 19B is a cross-sectional view taken along a line XIXB-XIXB in FIG. 19A.
Figure 19A:
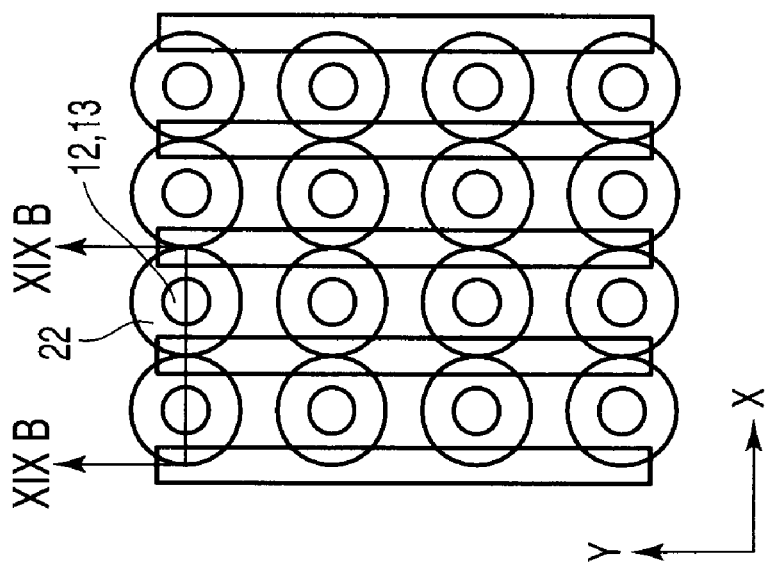
FIG. 19A is a plan view showing a manufacturing process of the magnetic random access memory according to the third embodiment of the present invention following FIG. 18A.

Then, as shown in FIGS. 19A and 19B, a silicide layer 22 is formed on each word line WL. As a material of this silicide layer 22, there is a material which is an example of the material of the silicide layer 19.

Figure 20B:
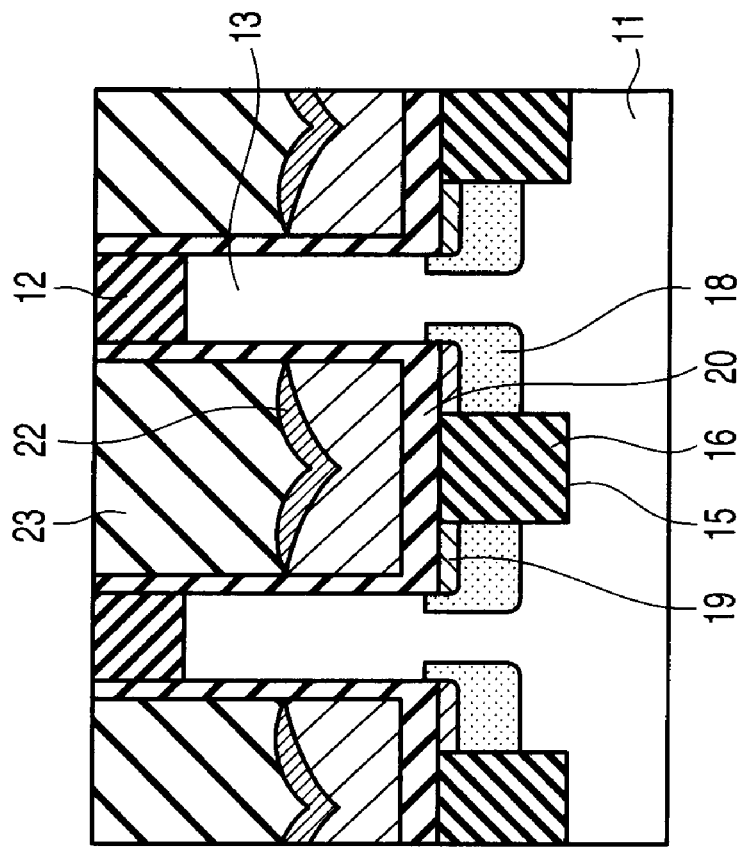
FIG. 20B is a cross-sectional view taken alone a line XXB-XXB in FIG. 20A.
Figure 20A:
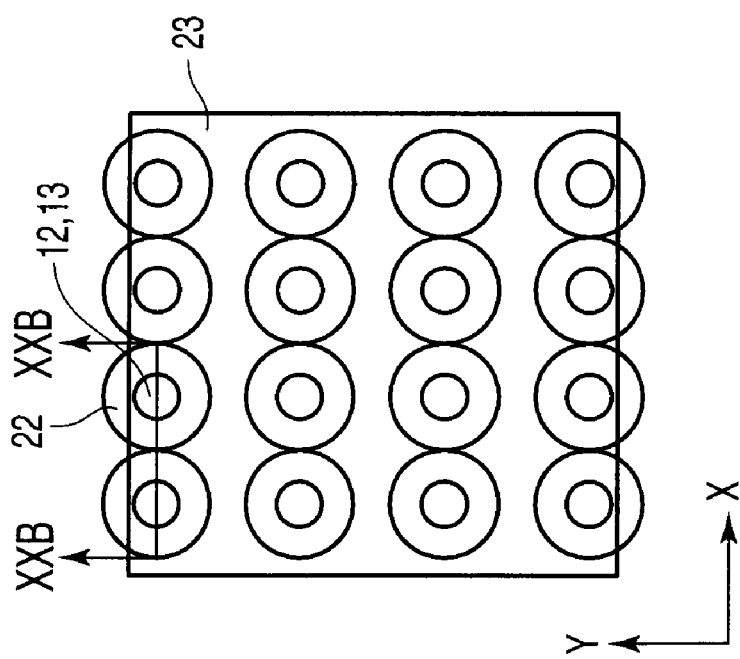
FIG. 20A is a plan view showing a manufacturing process of the magnetic random access memory according to the third embodiment of the present invention following FIG. 19A.

Subsequently, as shown in FIGS. 20A and 20B, an interlayer insulating film 23 is deposited on the silicide layer 22 and the gate insulating film 12. Furthermore, the interlayer insulating film 23 and the gate insulating film 12 are removed based on CMP until the silicon nitride film 12 is exposed.

Then, as shown in FIG. 21, the silicon nitride film 12 is removed. As a result, a top face of each convex portion 13 is exposed.

Subsequently, as shown in FIG. 22, a drain diffusion layer 24 is formed in each convex portion 13 by ion implantation and a heat treatment.

Figure 23:
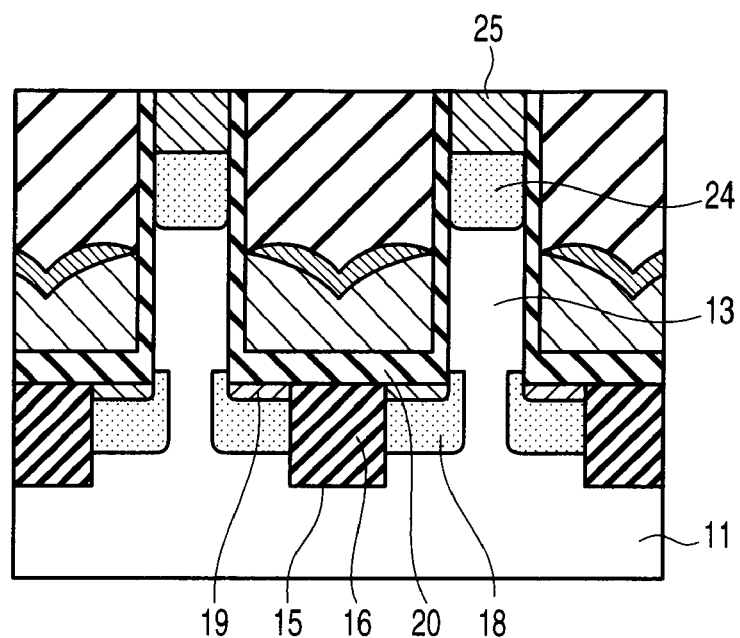
FIG. 23 is a cross-sectional view showing a manufacturing process of the magnetic random access memory according to the third embodiment of the present invention following FIG. 22.

Then, as shown in FIG. 23, an electroconductive material is deposited on the drain diffusion layer 24 and the interlayer insulating film 23, and the electroconductive material is flattened until the interlayer insulating film 23 is exposed. As a result, each contact 25 is formed on the drain diffusion layer 24.

Figure 24:
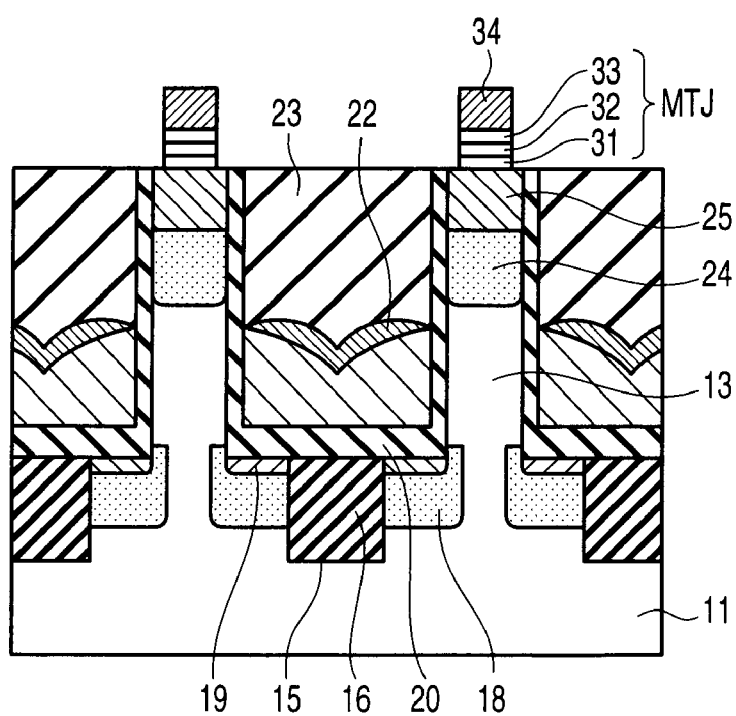
FIG. 24 is a cross-sectional view showing a manufacturing process of the magnetic random access memory according to the third embodiment of the present invention following FIG. 23.

Subsequently, as shown in FIG. 24, a fixed layer 31, a non-magnetic layer 32, a recording layer 33, and a contact 34 are sequentially deposited. Thereafter, the contact 34 is processed into a predetermined shape, and the fixed layer 31, the non-magnetic layer 32, and the recording layer 33 are patterned by using this contact 34. As a result, an MTJ element MTJ is formed.

Figure 25:
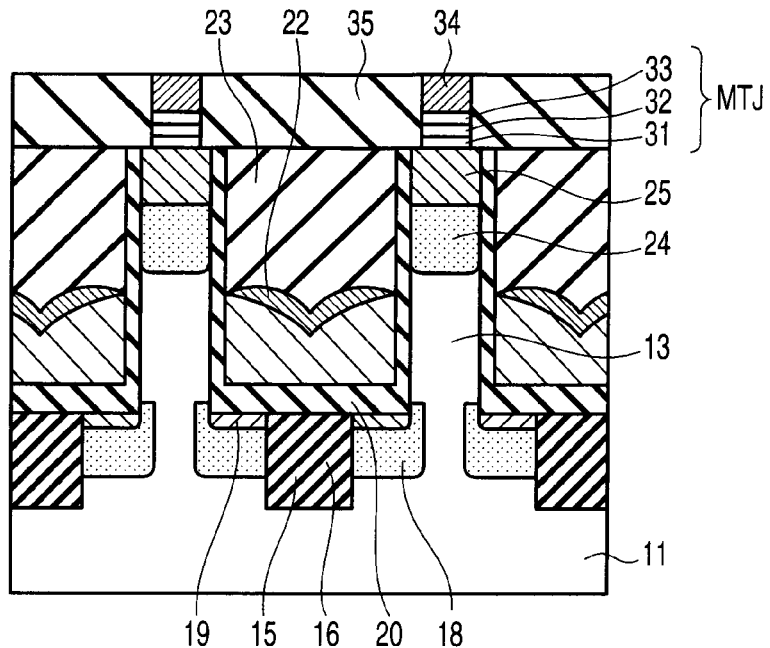
FIG. 25 is a cross-sectional view showing a manufacturing process of the magnetic random access memory according to the third embodiment of the present invention following FIG. 24.

Then, as shown in FIG. 25, an interlayer insulating film 35 is formed on the interlayer insulating film 23 and each contact 34, and the interlayer insulating film 35 is flattened based on CMP. As a result, each contact 34 is exposed.

Subsequently, as shown in FIGS. 5A and 5B, each bit line BL is deposited and processed on each contact 34 and the interlayer insulating film 35. As a result, the bit lines BL extended in the Y direction are formed.

[3-3] Effect

According to the third embodiment, the same effect as that of the first embodiment can be obtained. Furthermore, in the third embodiment, the gate electrodes G of cells which are adjacent to each other in the X direction are in contact with each other to function as word lines WL extended in the X direction. Therefore, the process can be facilitated and a cell area in the X direction can be further reduced as compared with an example where the gate electrodes G and the word lines WL are separately formed.

[4] Fourth Embodiment

The fourth embodiment is an example in which the contact on the MTJ element in the first embodiment is reduced in size. In this embodiment, the contact on the MTJ element in each of the second and third embodiments can be also reduced in size. It is to be noted that, in the fourth embodiment, an explanation on the same points as those in the first embodiment will be omitted.

[4-1] Structure

Figure 26:
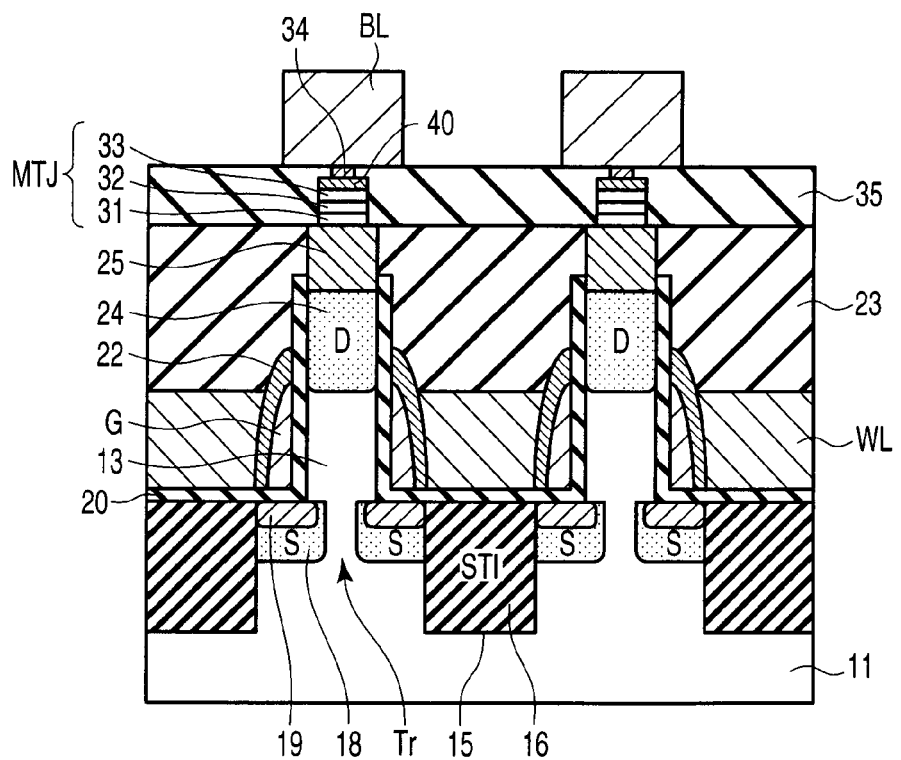
FIG. 26 is a cross-sectional view showing a magnetic random access memory according to a fourth embodiment of the present invention.

FIG. 26 is a cross-sectional view of a magnetic random access memory according to the fourth embodiment of the present invention. A structure of the magnetic random access memory according to the fourth embodiment will be explained hereinafter.

As shown in FIG. 26, the fourth embodiment is different from the first embodiment in that a contact 34 on each MTJ element MTJ is thinly formed and a gap layer 40 is provided between the contact 34 and the MTJ element MTJ. Therefore, an area where the contact 34 comes into contact with a recording layer 33 through the cap layer 40 is smaller than an area of the recording layer 33. It is to be noted that the contact 34 may be placed at the center of the MTJ element MTJ (the recording layer 33) or may be arranged to deviate from the center.

It is desirable for a resistance value of the cap layer 40 to be approximately one digit higher than a resistance value of the recording layer 33, for example. As a material of this cap layer 40, there is, e.g., a material of a non-magnetic layer 32 or a barrier metal layer having a large sheet resistance. Here, as to the material of the non-magnetic layer 32, please refer to a later-explained section [5-2]. As the barrier metal material, there are the following materials (a) to (k), for example.

(a) Ti (b) Ta (c) A compound containing Ti (e.g., TiN, TiW, TiSiN, $TiSi_x$, $TiB_2$, TiB, or TiC)

(d) A compound containing Ta (e.g., $TaB_2$, TaB, TaC, TaN, $Ta_4N_5$, $Ta_5N_6$, or $Ta_2N$)

(e) A compound containing Zr (e.g., $ZrB_2$, ZrB, ZrC, or ZrN)

(f) A compound containing Hf (e.g., HfB, HfC, or HfN)

(g) A compound containing V (e.g., $VB_2$, VB, VC, or VN)

(h) A compound containing Nb (e.g., $NbB_2$, NbB, NbC, or NbN)

(i) A compound containing Cr (e.g., $CrB_2$, CrB, $Cr_2B$, $Cr_3C_2$, $Cr_2N$, or CrN)

(j) A compound containing Mo (e.g., $MO_2B_3$, $MoB_2$, MoB, $MO_2B$, MoxCy, $Mo_2C$, or MoN)

(k) A compound containing W (e.g., $W_xB_y$, $W_2B_5$, $W_xC_y$, WC, $W_2C$, $W_xN_y$, or WN)

It is desirable for the cap layer 40 to have the same planar shape as the MTJ element MTJ in terms of easiness of processing, but this layer may have a different planar shape. It is desirable for a top face (a surface on the contact 34 side) of the cap layer 40 to have an area larger than that of a bottom surface (a surface on the cap layer 40 side) of the contact 34.

[4-2] Effect

According to the fourth embodiment, the same effect as that of the first embodiment can be obtained. Furthermore, in the fourth embodiment, thinly forming the contact 34 on the MTJ element MTJ enables reducing the area where the this contact 34 comes into contact with the recording layer 33 to be smaller than the area of the recording layer 33. Therefore, in a writing operation, when magnetization reversal occurs from a local contact portion of the contact 34 and the MTJ element MTJ and magnetization reversal is propagated based on a magnetic domain wall transfer effect, magnetization of the entire element is reversed. Therefore, in the writing operation, a writing current can be reduced by an effect of a small contact. Moreover, providing the cap layer 40 whose resistance is higher than that of the recording layer 33 enables avoiding a reduction in effect due to current diffusion.

[5] Fifth Embodiment

[5-1] Structure

The fifth embodiment is an example where a side surface of a concave portion is utilized to form a vertical transistor.

FIG. 27 is a cross-sectional view of a magnetic random access memory according to the fifth embodiment of the present invention. A structure of the magnetic random access memory according to the fifth embodiment will now be explained hereinafter.

As shown in FIG. 27, an element isolation insulating film 65 having an STI structure is formed in a semiconductor substrate (a silicon substrate) 51. A trench (a concave portion) 54 or 56 that is depressed with respect to a substrate surface is formed in an element region of the semiconductor substrate 51.

Here, an upper portion of the trench is referred to as an upper trench 54, and a lower portion of the trench is referred to as a lower trench 56. A gate electrode G is formed on a side surface of the upper trench 54 through a gate oxide film 62. An opening width of the lower trench 56 is wider than an opening width of the upper trench 54, and the lower trenches 56 of cells adjacent to each other are connected with each other. A source line SL is formed in the connected lower trenches 56 through an oxide film 57. The source line SL is electrically insulated from each gate electrode G through an oxide film 59.

A polysilicon film 66, a tungsten silicide film 67, and a silicon nitride film 68 are sequentially laminated on the gate electrode G. A silicon nitride film 69 is formed on a side surface of this laminated structure, and a silicon nitride film 70 is further formed to cover the laminated structure and the silicon nitride film 69.

A drain diffusion layer (D) 61 is formed on a surface of the semiconductor substrate 51. A source diffusion layer (S) 60 is formed in the semiconductor substrate 51 on the side surface of the upper trench 54 below the drain diffusion layer 61. The source diffusion layer 60 is connected with the source line SL. The source diffusion layer 60 is separated from the drain diffusion layer 61, and a space between the source diffusion layer 60 and the drain diffusion layer 61 serves as a channel region of a vertical transistor (e.g., an MOSFET) Tr. The upper surface of the semiconductor substrate 51 having the drain diffusion layer 61 formed thereon is placed below an upper surface of an element isolation insulating film 16.

A contact 72 is arranged on the drain diffusion layer 61, and an MTJ element MTJ is arranged on this contact 72. The MTJ element MTJ has a laminated structure in which a fixed layer 31, a non-magnetic layer 32, and a recording layer 33 are sequentially laminated. It is to be noted that the fixed layer 31 and the recording layer 33 can be counterchanged to arrange the recording layer 33 on the contact 72 side. A contact 34 is arranged on the MTJ element MTJ. A planar shape of this contact 34 is the same as, e.g., a planar shape of the MTJ element MTJ. The contact 34 is connected with a bit line BL.

[5-2] Manufacturing Method

FIGS. 28A and 28B to FIGS. 49A and 49B are manufacturing process diagrams of the magnetic random access memory according to the fifth embodiment of the present invention. It is to be noted that each FIG. A is a plan view and each FIG. B is a cross-sectional view. It is to be noted that a manufacturing method of the magnetic random access memory according to the fifth embodiment will now be explained hereinafter.

Figure 28A:
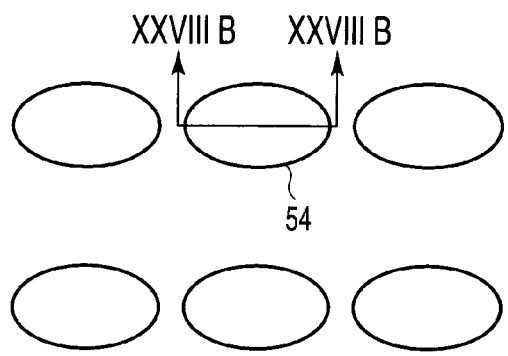
FIG. 28A is a plan view showing the magnetic random access memory according to the fifth embodiment of the present invention.
Figure 28B:
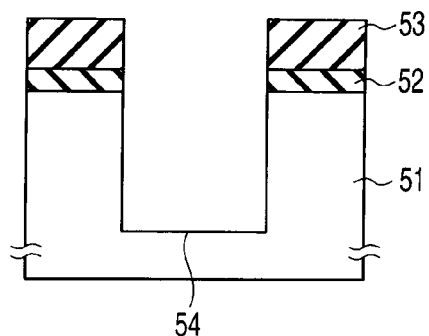
FIG. 28B is a cross-sectional view taken along a line XXVIIIB-XXVIIIB in FIG. 28A.

First, as shown in FIGS. 28A and 28B, a silicon nitride film 52 is deposited on the semiconductor substrate (a silicon substrate) 51, and a silicon oxide film 53 is deposited on this silicon nitride film 52. Then, the silicon nitride film 52 and the silicon oxide film 53 are patterned into a desired shape. The patterned silicon nitride film 52 and silicon oxide film 53 are used as masks to etch the semiconductor substrate 51 based on, e.g., RIE. As a result, the trench 54 is formed.

Figure 29A:
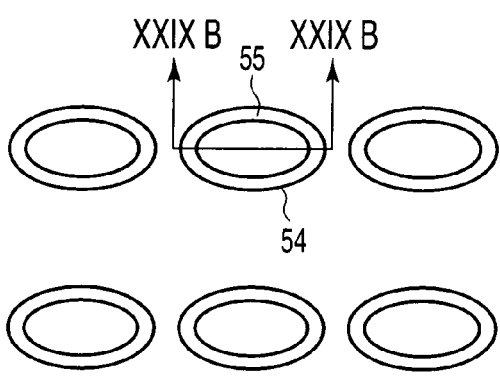
FIG. 29A is a plan view showing the magnetic random access memory according to the fifth embodiment of the present invention following FIG. 28A.
Figure 29B:
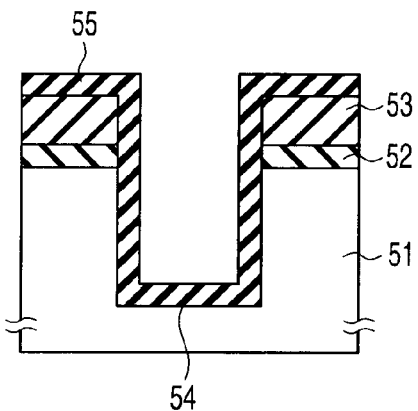
FIG. 29B is a cross-sectional view taken along a line XXIXB-XXIXB in FIG. 29A.

Subsequently, as shown in FIGS. 29A and 29B, a collar oxide film 55 constituted of, e.g., TEOS is formed on a bottom surface and a side surface of the trench 54 and an upper side of the silicon oxide film 53.

Figure 30A:
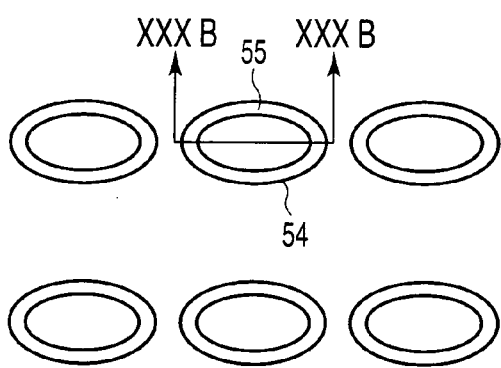
FIG. 30A is a plan view of the magnetic random access memory according to the fifth embodiment of the present invention following FIG. 29A.
Figure 30B:
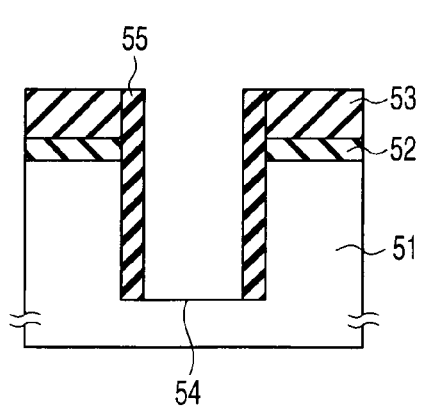
FIG. 30B is a cross-sectional view taken along a line XXXB-XXXB in FIG. 30A.

Then, as shown in FIGS. 30A and 30B, the collar oxide film 55 on the upper side of the silicon oxide film 53 and the bottom surface of the trench 54 is removed by anisotropic etching like RIE. As a result, the collar oxide film 55 remains on the side surfaces of the silicon nitride film 52, the silicon oxide film 53, and the trench 54.

Subsequently, as shown in FIGS. 31A and 31B, the semiconductor substrate 11 is removed from the exposed bottom surface of the trench 54 based on isotropic etching. As a result, the trench 56 coupled with a trench of an adjacent cell (not shown) is formed.

Then, as shown in FIGS. 32A and 32B, the collar oxide film 55 and the silicon oxide film 53 are removed.

Subsequently, an oxide film 57 constituted of, e.g., TEOS is formed on side surfaces and a bottom surface of the trenches 54 and 56 and an upper side of the silicon nitride film 52.

Then, as shown in FIGS. 34A and 34B, the trenches 54 and 56 are filled with a resist 80. Additionally, the resist 80 is exposed, and a top face of the resist 80 is lowered to be placed below a top face of the semiconductor substrate 51. Subsequently, the oxide film 57 exposed from the resist 80 is removed based on wet etching using, e.g., a fluorinated acid. As a result, the oxide film 57 remains on the side surface and the bottom portion of the lower trench 56. Thereafter, the resist 80 is removed.

Then, as shown in FIGS. 35A and 35B, a polysilicon film 58 having As doped therein is deposited in the trenches 54 and 56.

Subsequently, as shown in FIGS. 36A and 36B, the polysilicon film 58 is subjected to recess processing. As a result, a source line SL is formed in the lower trench 56. Here, the polysilicon film 58 is removed in such a manner that an upper portion of the source line SL directly comes into contact with the semiconductor substrate 51 in order to assure a conducting region.

Figure 37A:
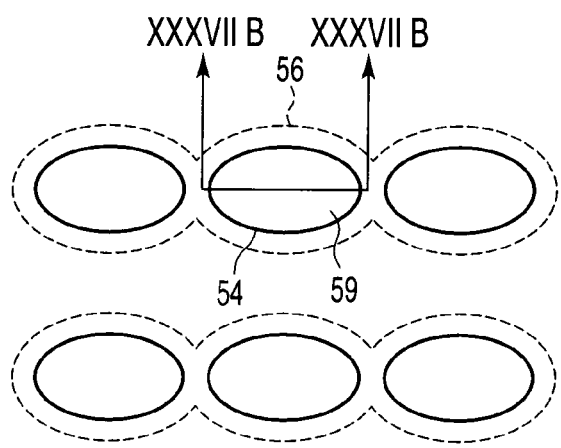
FIG. 37A is a plan view of the magnetic random access memory according to the fifth embodiment of the present invention following FIG. 36A.
Figure 37B:
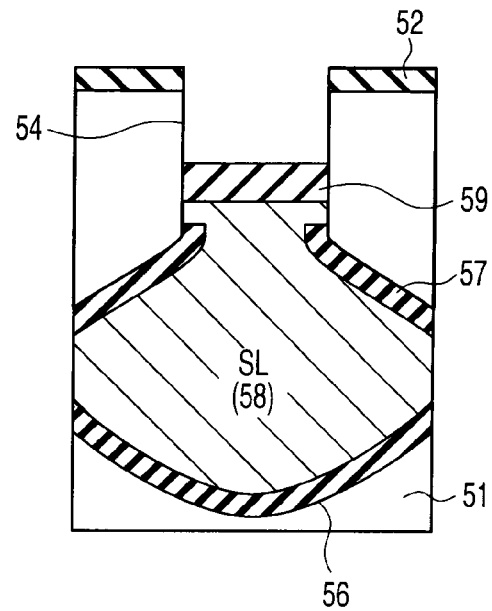
FIG. 37B is a cross-sectional view taken along a line XXXVIIB-XXXVIIB in FIG. 37A.

Then, as shown in FIGS. 37A and 37B, the oxide film 59 formed of, e.g., TEOS is deposited on the source line SL and the silicon nitride film 52 by, e.g., a bias CVD method. Subsequently, the oxide film 59 is etched to remain on the source line SL alone.

Figure 38A:
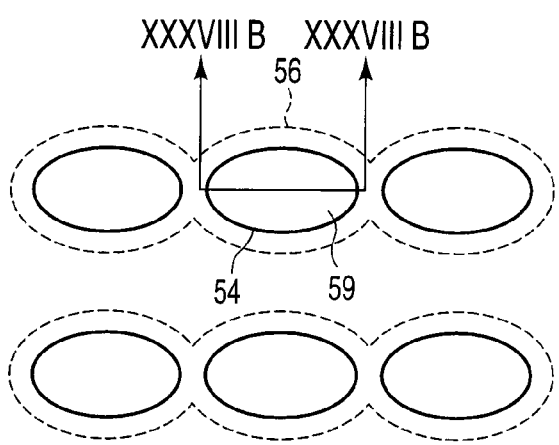
FIG. 38A is a plan view of the magnetic random access memory according to the fifth embodiment of the present invention following FIG. 37A.
Figure 38B:
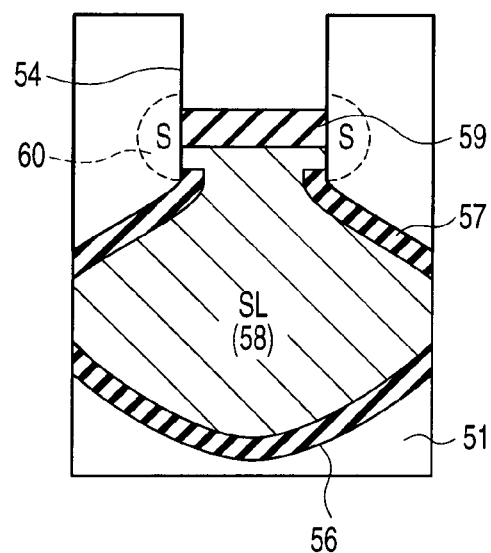
FIG. 38B is a cross-sectional view taken along a line XXXVIIIB-XXXVIIIB in FIG. 38A.

Then, as shown in FIGS. 38A and 38B, the silicon nitride film 52 is removed to expose the semiconductor substrate 51. Subsequently, As is diffused from the polysilicon film 58 having As doped therein by a heat treatment, thereby forming the source diffusion layer 60 in the semiconductor substrate 51.

Figure 39A:
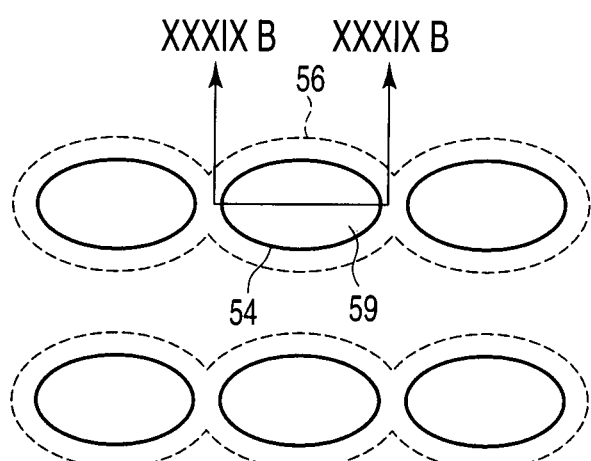
FIG. 39A is a plan view of the magnetic random access memory according to the fifth embodiment of the present invention following FIG. 38A.
Figure 39B:
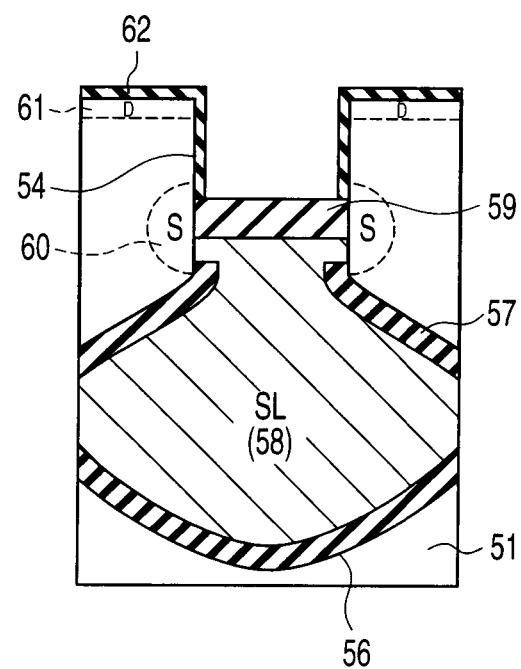
FIG. 39B is a cross-sectional view taken along a line XXXIXB-XXXIXB in FIG. 39A.

Then, as shown in FIGS. 39A and 39B, ion implantation and a heat treatment are carried out to form the drain diffusion layer 61 on the surface of the semiconductor substrate 51. Subsequently, the gate oxide film 62 is formed on the semiconductor substrate 51 and the side surface of the trench 54.

Figure 40B:
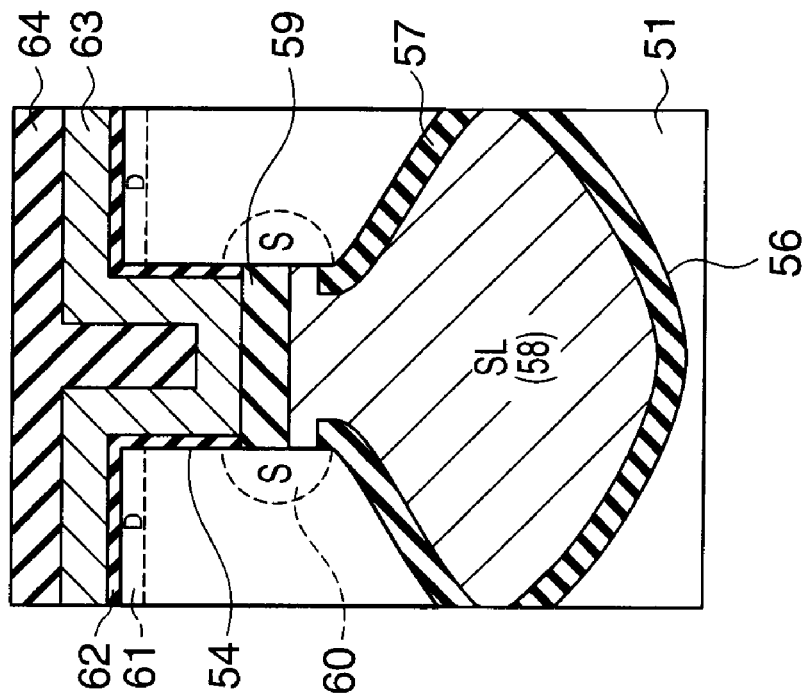
FIG. 40B is a cross-sectional view taken along a line XLB-XLB in FIG. 40A.
Figure 40A:
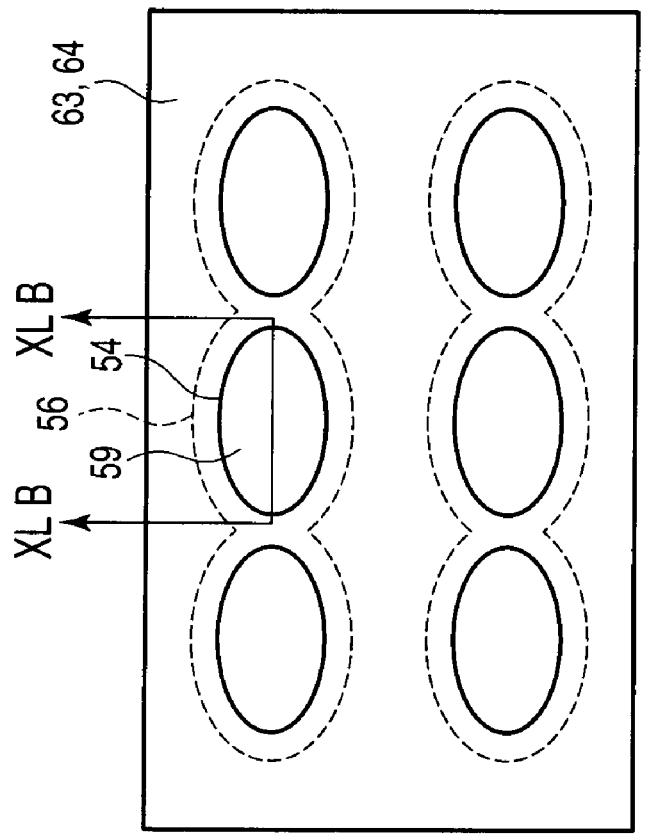
FIG. 40A is a plan view of the magnetic random access memory according to the fifth embodiment of the present invention following FIG. 39A.

Then, as shown in FIGS. 40A and 40B, a polysilicon film 63 serving as a gate material is deposited on the gate oxide film 62 and the oxide film 59, and a silicon nitride film 64 is deposited on this polysilicon film 63.

Figure 41B:
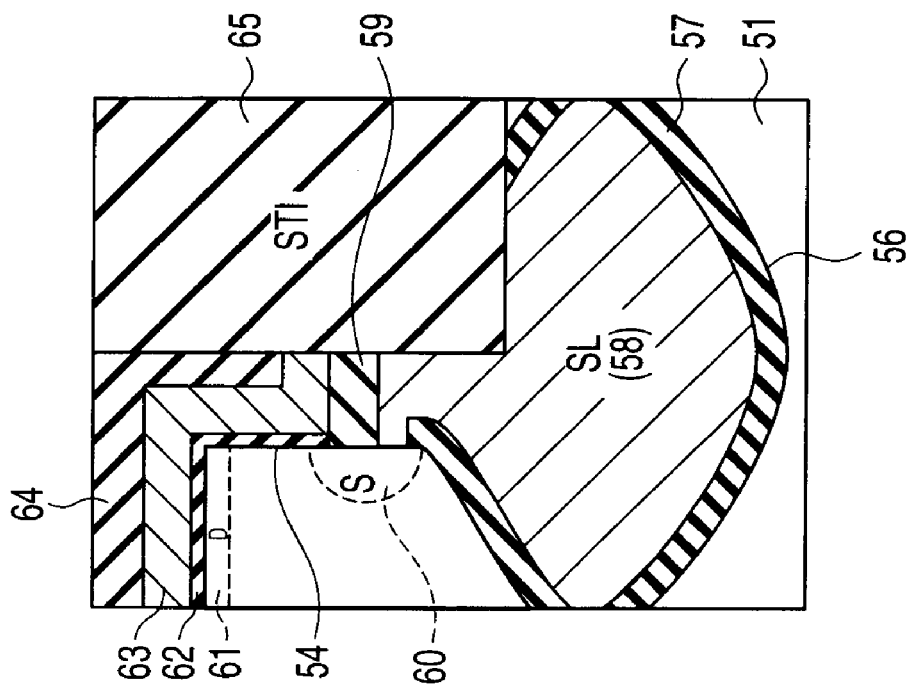
FIG. 41B is a cross-sectional view taken along a line XLIB-XLIB in FIG. 41A.
Figure 41A:
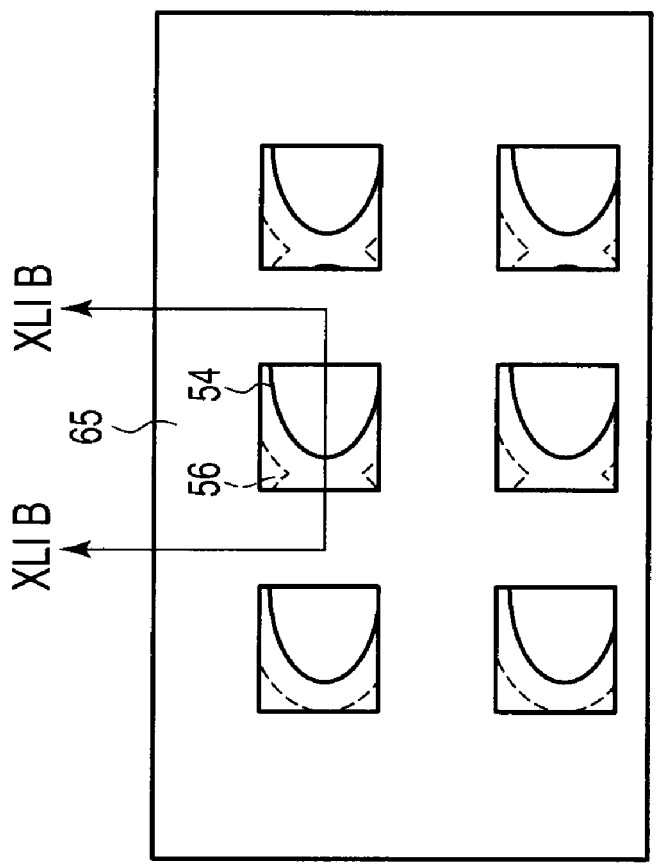
FIG. 41A is a plan view of the magnetic random access memory according to the fifth embodiment of the present invention following FIG. 40A.

Subsequently, as shown in FIGS. 41A and 41B, an element isolation groove is formed in the semiconductor substrate 51, and an element isolation film 65 is buried in this element isolation groove. At this time, the polysilicon film 63 whose amount is approximately half of the trench 54 is caused to remain.

Figure 42B:
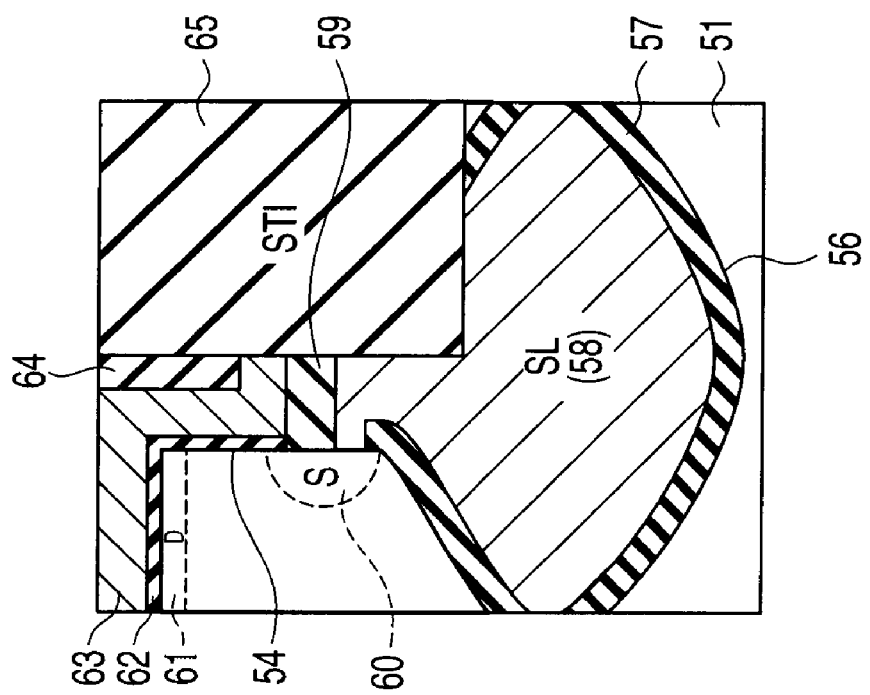
FIG. 42B is a cross-sectional view taken along a line XLIIB-XLIIB in FIG. 42A.
Figure 42A:
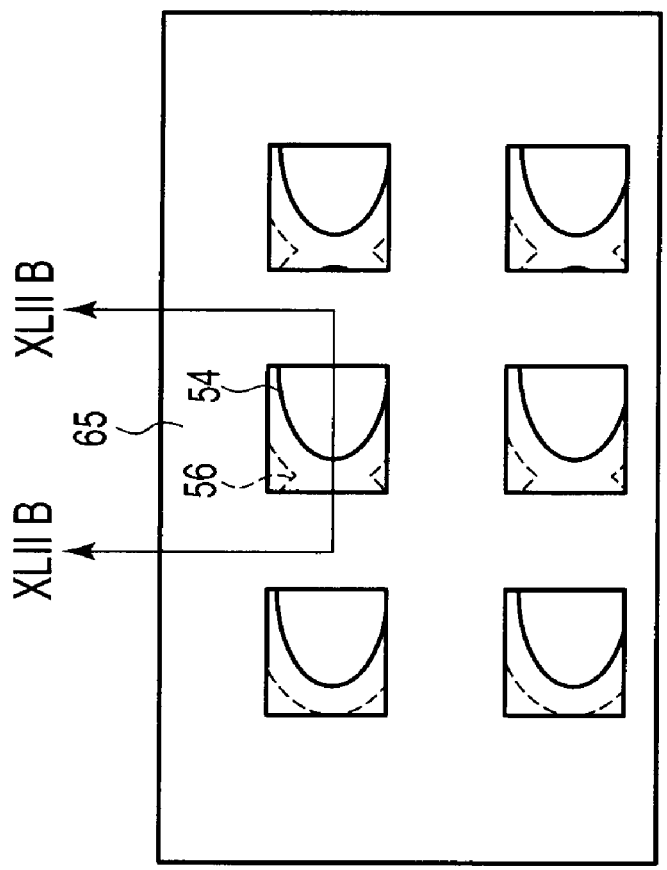
FIG. 42A is a plan view of the magnetic random access memory according to the fifth embodiment of the present invention following FIG. 41A.

Then, as shown in FIGS. 42A and 42B, the silicon nitride film 64 and the element isolation insulating film 65 are partially removed. As a result, the polysilicon film 63 is exposed.

Figure 43B:
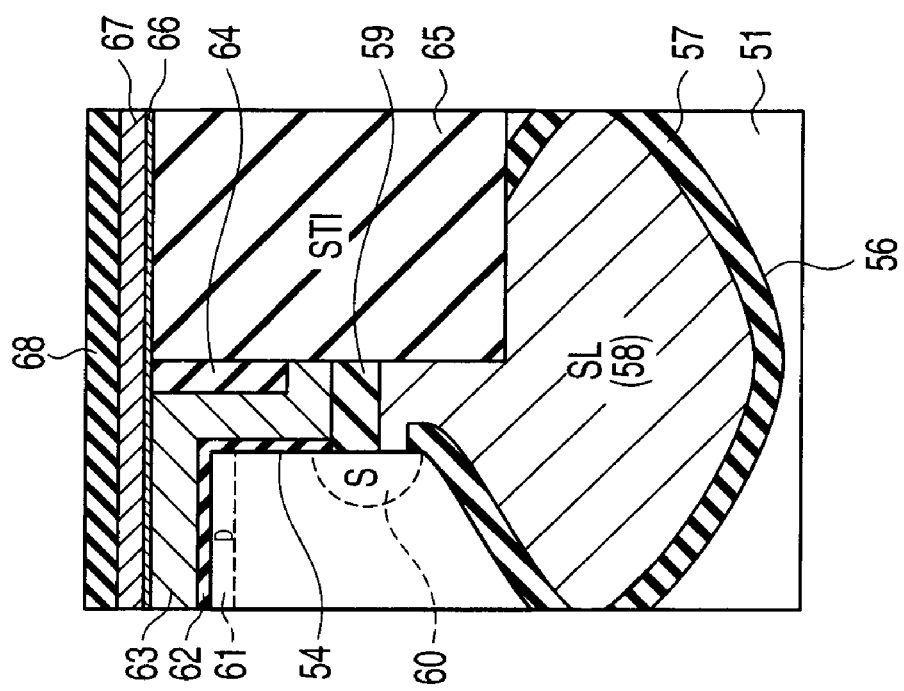
FIG. 43B is a cross-sectional view taken along a line XLIIIB-XLIIIB in FIG. 43A.
Figure 43A:
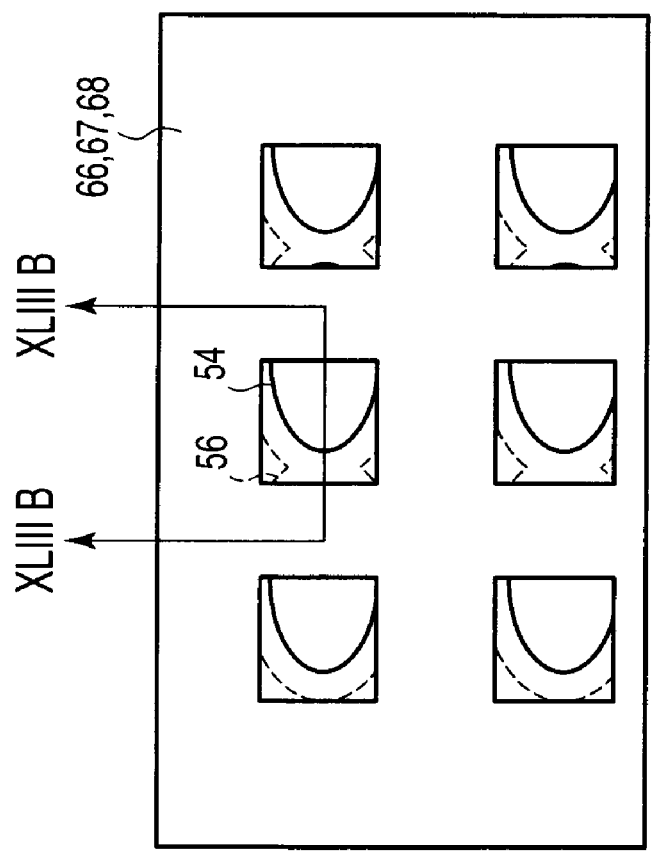
FIG. 43A is a plan view of the magnetic random access memory according to the fifth embodiment of the present invention following FIG. 42A.

Subsequently, as shown in FIGS. 43A and 43B, the polysilicon film 66, the tungsten silicide film 67, and the silicon nitride film 68 are sequentially deposited on the polysilicon film 63 and the element isolation insulating film 65.

Figure 44B:
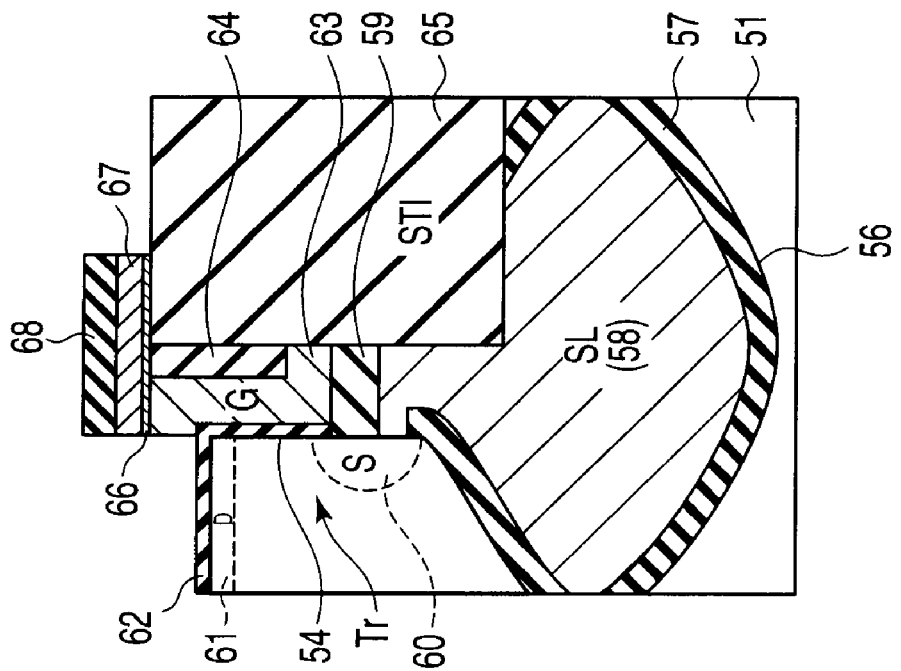
FIG. 44B is a cross-sectional view taken along a line XLIVB-XLIVB in FIG. 44A.
Figure 44A:
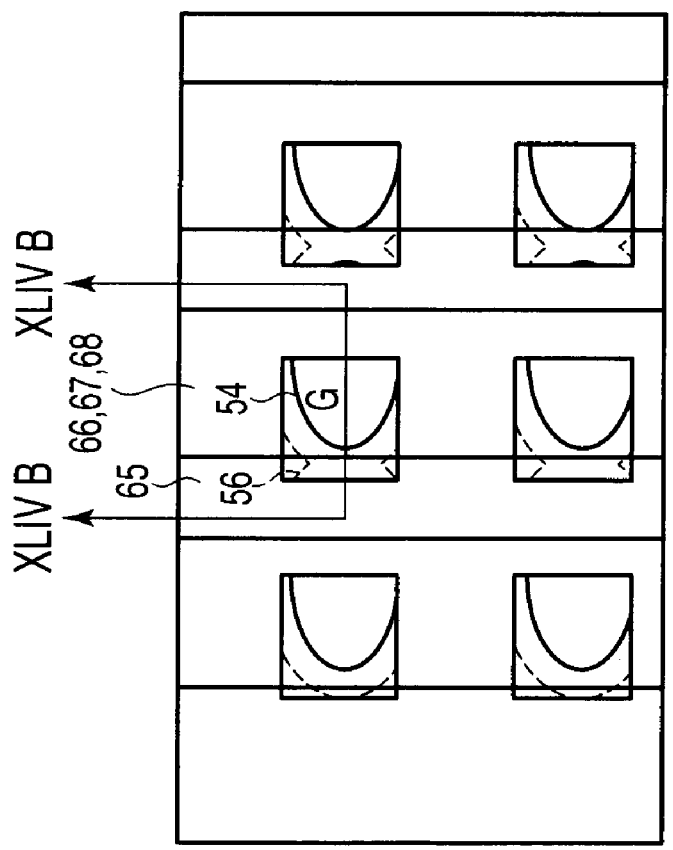
FIG. 44A is a plan view of the magnetic random access memory according to the fifth embodiment of the present invention following FIG. 43A.

Then, as shown in FIGS. 44A and 44B, the polysilicon films 63 and 66, the tungsten silicide film 67, and the silicon nitride film 68 are processed. As a result, the vertical transistor Tr having the gate electrode G provided on the side surface of the trench 56 is formed.

Figure 45B:
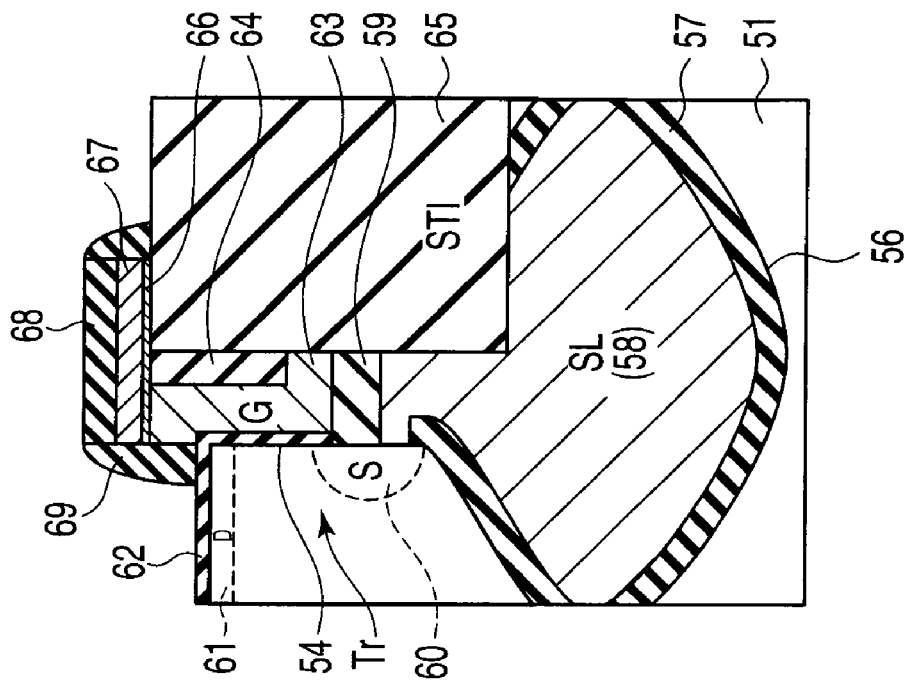
FIG. 45B is a cross-sectional view taken along a line XLVB-XLVB in FIG. 45A.
Figure 45A:
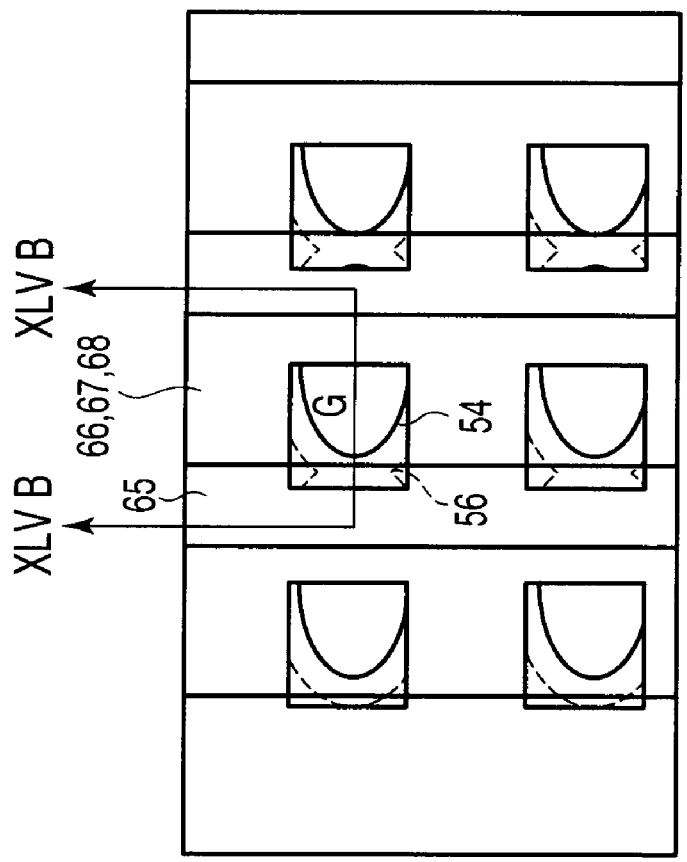
FIG. 45A is a plan view of the magnetic random access memory according to the fifth embodiment of the present invention following FIG. 44A.

Subsequently, as shown in FIGS. 45A and 45B, the silicon nitride film 69 is deposited on a side surface of a laminated structure of the gate.

Figure 46B:
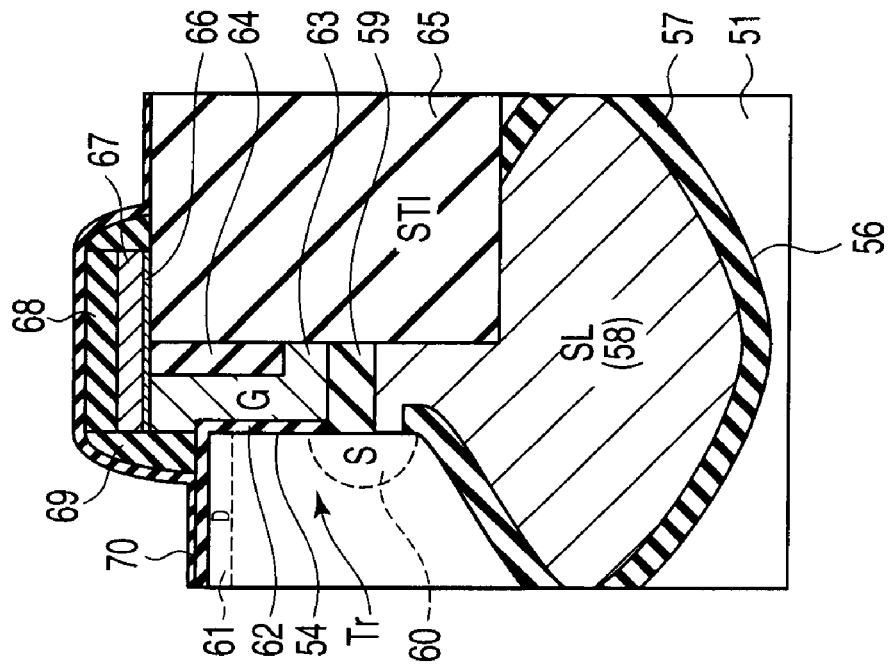
FIG. 46B is a cross-sectional view taken along a line XLVIB-XLVIB in FIG. 46A.
Figure 46A:
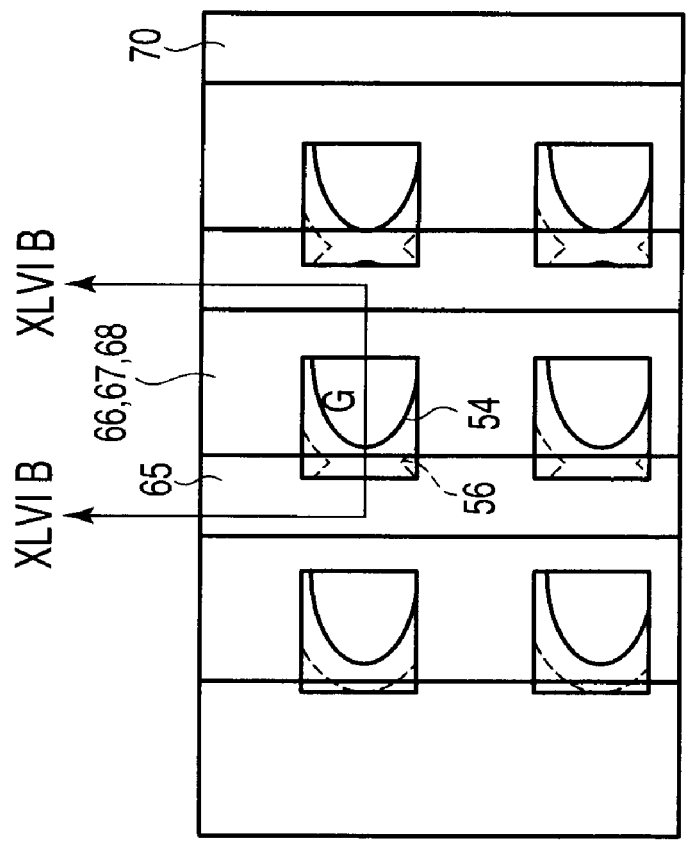
FIG. 46A is a plan view of the magnetic random access memory according to the fifth embodiment of the present invention following FIG. 45A.

Then, as shown in FIGS. 46A and 46B, a silicon nitride film 70 is deposited on the entire surface of the semiconductor substrate 51.

Figure 47B:
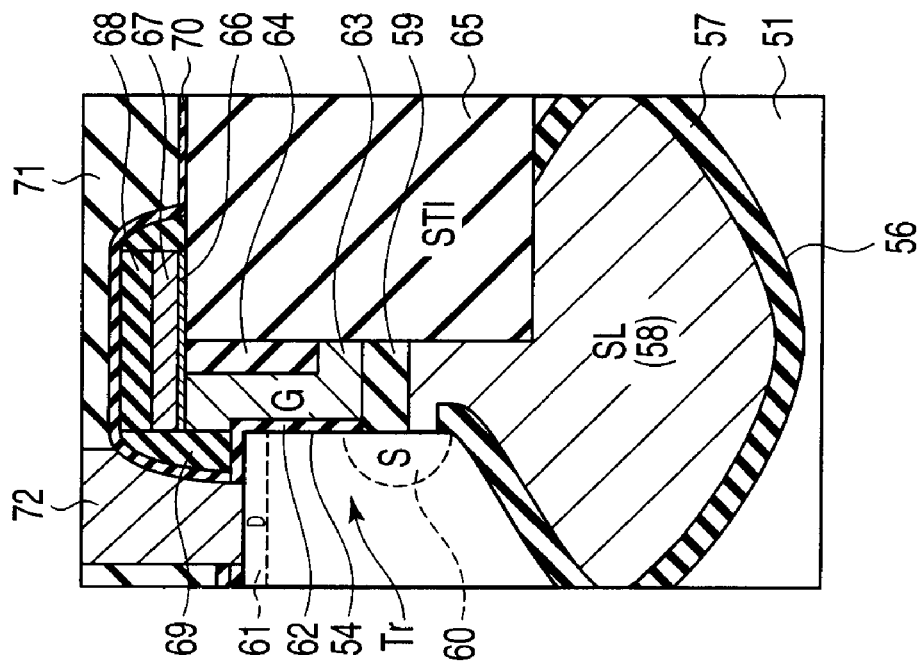
FIG. 47B is a cross-sectional view taken along a line XLVIIB-XLVIIB in FIG. 47A.
Figure 47A:
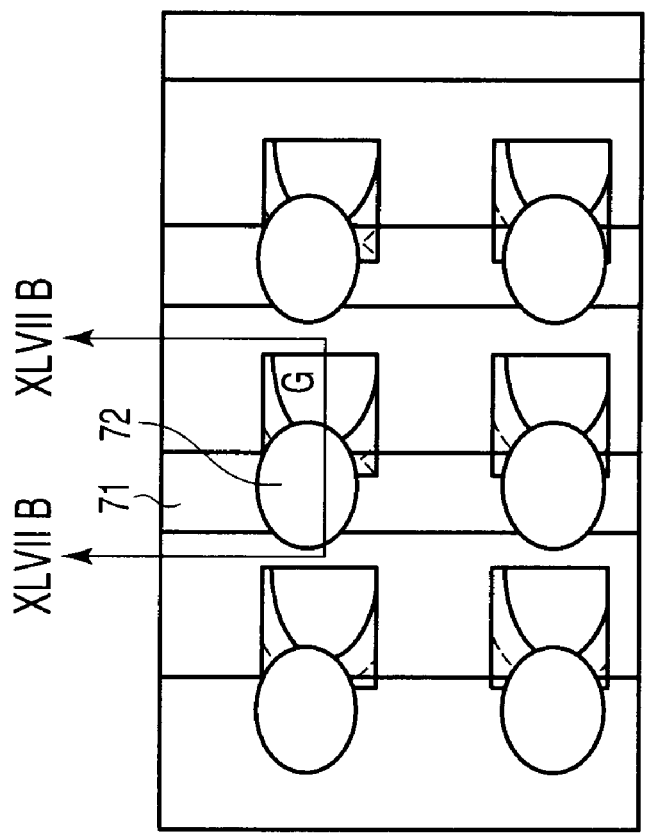
FIG. 47A is a plan view of the magnetic random access memory according to the fifth embodiment of the present invention following FIG. 46A.

Subsequently, as shown in FIGS. 47A and 47B, an interlayer insulating film 71 formed of a silicon oxide film is deposited on the silicon nitride film 70. Further, the contact 72 containing tungsten is formed in the interlayer insulating film 71, and this contact 72 is connected with the drain diffusion layer 61.

Figure 48B:
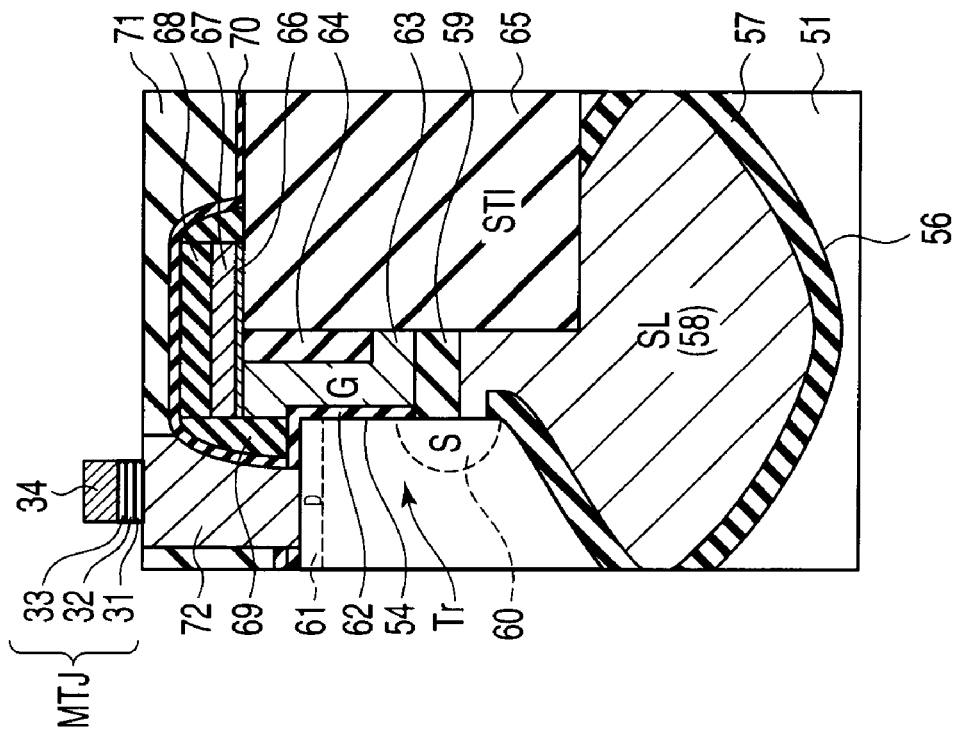
FIG. 48B is a cross-sectional view taken along a line XLVIIIB-XLVIIIB in FIG. 48A.
Figure 48A:
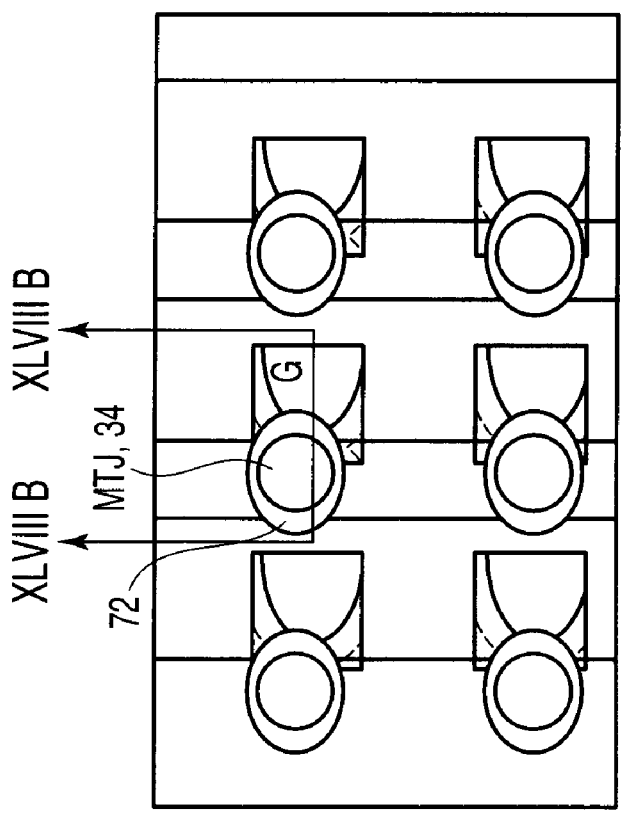
FIG. 48A is a plan view of the magnetic random access memory according to the fifth embodiment of the present invention following FIG. 47A.

Then, as shown in FIGS. 48A and 48B, the MTJ element MTJ is formed on the contact 72, and the contact 34 is formed on the MTJ element MTJ.

Figures 49A, 49B:
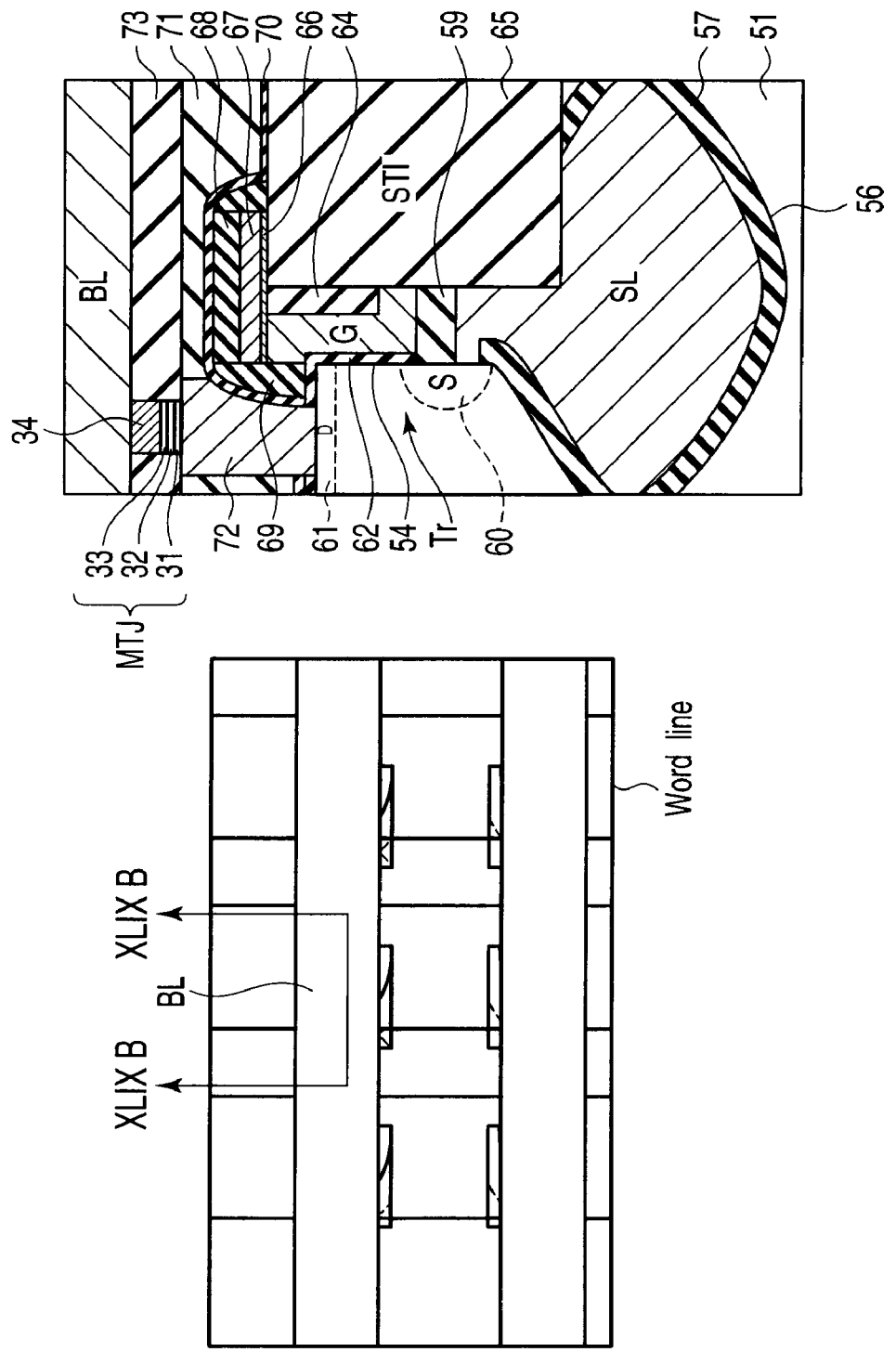
FIG. 49A is a plan view of the magnetic random access memory according to the fifth embodiment of the present invention following FIG. 48A.
FIG. 49B is a cross-sectional view taken along a line XLIXB-XLIXB in FIG. 49A.

Subsequently, as shown in FIGS. 49A and 49B, an interlayer insulating film 74 formed of a silicon oxide film is deposited on the contact 34 and the interlayer insulating film 71 and flattened until the contact 34 is exposed. Then, the bit line BL connected with the contact 34 is formed.

[5-3] Effect

According to the fifth embodiment, the same effect as that of the first embodiment can be obtained. Further, in the fifth embodiment, the side surface of the trench 54 is utilized to form the vertical transistor Tr, and the source line SL is formed in the trench 56. Therefore, as compared with an example where the convex portion is utilized to form the vertical transistor, lithography or processing on a step other than the inside of the groove can be reduced, or a height of the step can be decreased, thereby facilitating processing.

[6] Sixth Embodiment

In the sixth embodiment, the MTJ element used in each embodiment will be explained.

[6-1] Magnetization Arrangement

Magnetization directions of the fixed layer 31 and the recording layer 33 in the MTJ element MTJ may face a direction perpendicular to a film surface (a perpendicular magnetization type) or may face a direction parallel to the film surface (a parallel magnetization direction).

It is to be noted that the perpendicular magnetization type MTJ element MTJ has an advantage that magnetization directions are not determined in a longitudinal direction of an element shape like a conventional example.

[6-2] Material

The MTJ element MTJ is formed of, e.g., each of the following materials.

As materials of the fixed layer 31 and the recording layer 33, using, e.g., Fe, Co, Ni, an alloy of these materials, magnetite having a large spin polarizability, an oxide such as $CrO_2$ or $RXMnO_{3-y}$ (R; rare earth, X; Ca, Ba, Sr) or a Heusler alloy such as NiMnSb or PtMnSb is desirable. Furthermore, these magnetic materials may contain a non-magnetic element, e.g., Ag, Cu, Au, Al, Mg, Si, Bi, Ta, B, C, O, N, Pd, Pt, Zr, Ir, W, Mo, or Nb to some extent as long as ferromagnetism is not lost.

As a material of the non-magnetic layer 32, various kinds of dielectric materials, e.g., $Al_2O_3$, $SiO_2$, MgO, AlN, $Bi_2O_3$, $MgF_2$, $CaF_2$, $SrTiO_2$, $AlLaO_3$, and others can be used. Each of these dielectric materials may have a deficit of oxygen, nitrogen, or fluorine.

An antiferromagnetic layer that secures the magnetization direction of the fixed layer 31 may be provided on a surface of the fixed layer 31 on the opposite side of the non-magnetic layer 32. As a material of this antiferromagnetic layer, using, e.g., Fe—Mn, Pt—Mn, Pt—Cr—Mn, Ni—Mn, Ir—Mn, NiO, or $Fe_2O_3$ is preferable.

It is to be noted that the following materials are present as examples of a perpendicular magnetic material that realizes the perpendicular magnetization type MTJ element MTJ.

First, a magnetic material having a high coercive force that is used as a perpendicular magnetic material of each of the fixed layer 31 and the recording layer 33 is constituted of a material having a high magnetic anisotropic energy that is equal to or above $1 \times 10^6$ erg/cc. Examples of this material will now be explained hereinafter.

Example 1

"A material formed of an alloy containing at least one of Fe (iron), Co (cobalt), and Ni (nickel) and at least one of Cr (chrome), Pt (platinum), and Pd (palladium)".

For example, as an ordered alloy, there is, e.g., Fe(50)Pt (50), Fe(50)Pd(50), or Co(50)Pt(50). For example, as a disordered alloy, there is a CoCr alloy, a CoPt alloy, a CoCrPt alloy, a CoCrPtTa alloy, or CoCrNb alloy.

Example 2

"A material having a structure in which at least one of Fe, Co, and Ni or an alloy containing one of these materials and at least one of Pd and Pt or an alloy containing one of these materials are alternately laminated".

For example, there is a Co/Pt artificial lattice, a Co/Pd artificial lattice, or a CoCr/Pt artificial lattice. When the Co/Pt artificial lattice is used or when the Co/Pd artificial lattice, a large rate of change in a resistance (an MR ratio), i.e., approximately 40% can be realized.

Example 3

"An amorphous alloy formed of at least one of rare-earth metals, e.g., Tb (terbium), Dy (dysprosium), or Gd (gadolinium) and at least one of transition metals".

For example, there is TbFe, TbCo, TbFeCo, DyTbFeCo, or GdTbCo.

Moreover, the recording layer 3 may be formed of the above-explained magnetic material having a high coercive force, or may be formed of a magnetic material whose magnetic anisotropic energy density is reduced to be smaller than that of the magnetic material having a high coercive force by, e.g., adjusting a composition ratio, adding an impurity, or adjusting a thickness. Examples of such materials will now be explained hereinafter.

Example 1

"A material obtained by adding an impurity to an alloy containing at least one of Fe, Co, and Ni and at least one of Cr, Pt, and Pd".

For example, as an ordered alloy, there is an alloy whose magnetic anisotropic energy density is reduced by adding an impurity such as Cu, Cr, or Ag to Fe(50)Pt(50), Fe(50)Pd(50), or Co(50)Pt(50). For example, as a disordered alloy, there is an alloy whose magnetic anisotropic density is reduced by increasing a percentage of a non-magnetic element in a CoCr alloy, a CoPt alloy, a CoCrPt alloy, a CoCrPtTa alloy, or a CoCrNb alloy.

Example 2

"A material which has a structure where at least one of Fe, Co, and Ni or an alloy containing at least one of these materials and one of Pd and Pt or an alloy containing one of these materials are alternately laminated and a thickness of a layer formed of the former element or alloy or a thickness of a layer formed of the latter element or alloy is adjusted".

There are an optimum value of a thickness of at least one of Fe, Co, and Ni or an alloy containing one of these materials and an optimum value of a thickness of one of Pd and Pt or an alloy containing one of these materials, and a magnetic anisotropic energy density is gradually reduced when the thicknesses deviate from these optimum values.

Example 3

"A material obtained by adjusting a composition ratio of an amorphous alloy formed of at least one of rare-earth metals, e.g., Tb (terbium), Dy (dysprosium), or Dg (gadolinium) and at least one of transition metals".

For example, there is a material obtained by adjusting a composition ratio of an amorphous alloy such as TbFe, TbCo, TbFeCo, DyTbFeCo, or GdTbCo to reduce a magnetic anisotropic energy density.

[6-3] Planar Shape

Although the MTJ element MTJ has a circular planar shape in each of the foregoing embodiments, the present invention is not restricted thereto. The planar shape of the MTJ element MTJ can be modified into various shapes, e.g., a rectangular shape, a square shape, an elliptic shape, a hexagonal shape, a rhombic shape, a parallelogram shape, a cross shape, a bean-like shape (a concave shape), and others.

In case of the parallel magnetization type MTJ element MTJ, when utilizing a shape magnetic anisotropy, assuming that a narrow side direction (a direction along which magnetization is difficult) of the MTJ element MTJ is F (a minimum processing dimension), a shape in which a longitudinal direction (a direction along which magnetization is easy) is approximately 2 F is desirable.

In case of the perpendicular magnetization type MTJ element MTJ, since a magnetization direction is not dependent on a shape, any one of the above-explained shapes can be used.

[6-4] Tunnel Junction Structure

The MTJ element MTJ may have a single tunnel junction (a single junction) structure or a double tunnel junction (a double junction) structure.

As shown in FIG. 1 and others, an MTJ element MTJ in a single tunnel junction structure has a fixed layer 31, a recording layer 33, and a non-magnetic layer 32 provided between the fixed layer 31 and the recording layer 33. That is, the MTJ element MTJ has the single non-magnetic layer.

An MTJ element MTJ in a double tunnel junction structure has a first fixed layer, a second fixed layer, a recording layer provided between the first and second fixed layers, a first non-magnetic layer provided between the first fixed layer and the recording layer, and a second non-magnetic layer provided between the second fixed layer and the recording layer. That is, the MTJ element MTJ has the two non-magnetic layers.

In case of the double tunnel junction structure, an MR (Magnetoresistive) ratio (a rate of change in a resistance in a state "1" or a state "0") when the same external bias is applied is less degraded and an operation can be performed with a higher bias as compared with the single tunnel junction structure. That is, the double tunnel junction structure is advantageous when reading information in a cell.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a semiconductor substrate in which a step portion having a side surface and a top face is formed;
a gate electrode formed on the side surface of the step portion through a gate insulating film;
a drain diffusion layer formed in the top face of the step portion;
a source diffusion layer formed in the semiconductor substrate below the drain diffusion layer to be separated from the drain diffusion layer;
a magnetoresistive effect element which is connected with the drain diffusion layer, and has a fixed layer whose magnetization direction is fixed, a recording layer whose magnetization direction is reversible, and a non-magnetic layer provided between the fixed layer and the recording layer, the magnetization directions of the fixed layer and the recording layer entering a parallel state or an antiparallel state in accordance with a direction of a current flowing through a space between the fixed layer and the recording layer; and
a bit line connected with the magnetoresistive effect element.

2. The memory according to claim 1,
wherein the step portion is a convex portion protruding from a substrate surface, and
the source diffusion layer is formed in the semiconductor substrate at the base of the convex portion.

3. The memory according to claim 2,
wherein the source diffusion layer has a space provided below the drain diffusion layer.

4. The memory according to claim 2,
wherein a planar shape of the gate electrode is a ring-like shape surrounding the side surface of the convex portion.

5. The memory according to claim 2,
wherein the magnetoresistive effect element is placed immediately above the convex portion.

6. The memory according to claim 2, further comprising:
a contact which is formed on the convex portion, connected with the drain diffusion layer and the magnetoresistive effect element, and has the same planar shape as a planar shape of the convex portion.

7. The memory according to claim 2, further comprising:
a word line which is formed on the semiconductor substrate and connected with the gate electrode,
wherein the source diffusion layer and the bit line are extended in the same first direction, and
the word line is extended in a second direction crossing the first direction.

8. The memory according to claim 2, further comprising:
a word line which is formed on the semiconductor substrate and connected with the gate electrode,
wherein the source diffusion layer and the word line are extended in the same first direction, and
the bit line is extended in a second direction crossing the first direction.

9. The memory according to claim 2,
wherein the source diffusion layer and the bit line are extended in the same first direction, and
the gate electrode is extended in a second direction crossing the first direction.

10. The memory according to claim 9,
wherein the gate electrode is directly in contact with a gate electrode which is adjacent thereto in the second direction.

11. The memory according to claim 1, further comprising:
a contact which is connected with the recording layer and has a contact area with respect to the recording layer being smaller than an area of the recording layer.

12. The memory according to claim 11, further comprising:
a cap layer which is provided between the recording layer and the contact and has a resistance value higher than a resistance value of the recording layer.

13. The memory according to claim 1,
wherein the step portion is a concave portion which is depressed with respect to the substrate surface, and
the memory further comprises a source line which is formed on a bottom of the concave portion and connected with the source diffusion layer.

* * * * *